(12) United States Patent
Ino et al.

(10) Patent No.: US 8,390,054 B2
(45) Date of Patent: Mar. 5, 2013

(54) SEMICONDUCTOR MEMORY ELEMENT AND SEMICONDUCTOR MEMORY DEVICE

(75) Inventors: Tsunehiro Ino, Kanagawa-ken (JP); Daisuke Matsushita, Kanagawa-ken (JP); Yasushi Nakasaki, Kanagawa-ken (JP); Masao Shingu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 156 days.

(21) Appl. No.: 12/880,748

(22) Filed: Sep. 13, 2010

(65) Prior Publication Data
US 2011/0241101 A1 Oct. 6, 2011

(30) Foreign Application Priority Data
Mar. 31, 2010 (JP) ................. P2010-084332

(51) Int. Cl.
*H01L 29/788* (2006.01)
*H01L 29/792* (2006.01)
(52) U.S. Cl. .............. 257/324; 257/315; 257/E29.3; 257/E29.306; 257/E29.309
(58) Field of Classification Search ............ 257/314, 257/E29.3, E29.309, 315, 324, E29.306
See application file for complete search history.

(56) References Cited

U.S. PATENT DOCUMENTS
| 2005/0045943 A1* | 3/2005 | Lung et al. ............... 257/325 |
| 2006/0125027 A1* | 6/2006 | Chien et al. .............. 257/410 |
| 2008/0121963 A1* | 5/2008 | Govindarajan .......... 257/310 |
| 2009/0085160 A1* | 4/2009 | Lee et al. ................. 257/532 |
| 2009/0212346 A1 | 8/2009 | Ino et al. |

FOREIGN PATENT DOCUMENTS
| JP | 2004-161602 | | 6/2004 |
| JP | 2008-218482 | * | 9/2008 |
| JP | 2009-81203 | | 4/2009 |
| JP | 2010-62239 | | 3/2010 |

OTHER PUBLICATIONS

U.S. Appl. No. 13/235,970, filed Sep. 19, 2011, Ino et al.
Jae Sub Oh, et al., "SONOS-Type Flash Memory with HfO₂ Thinner that 4 nm as Trapping Layer Using Atomic Layer Deposition", IEICE Trans. Electron., vol. E93-C, No. 5, May 2010, pp. 590-595.
Notification of Reasons for Refusal issued Mar. 2, 2012 in Japanese Patent Application No. 2010-084332 (with English translation).

* cited by examiner

*Primary Examiner* — Jerome Jackson, Jr.
*Assistant Examiner* — Paul Budd
(74) *Attorney, Agent, or Firm* — Oblon, Spivak, McClelland, Maier & Neustadt, L.L.P.

(57) ABSTRACT

According to one embodiment, a semiconductor memory element includes a semiconductor layer, a tunnel insulator provided on the semiconductor layer, a charge accumulation film provided on the tunnel insulator having a film thickness of 0.9 nm or more and 2.8 nm or less and the charge accumulation film containing cubic $HfO_2$ particles, a block insulator provided on the charge accumulation film, and a control electrode provided on the block insulator.

21 Claims, 15 Drawing Sheets

SEMICONDUCTOR MEMORY ELEMENT AND SEMICONDUCTOR MEMORY DEVICE

CROSS REFERENCE TO RELATED APPLICATION

This application is based upon and claims the benefit of priority from prior Japanese Patent Application No. 2010-084332, filed on Mar. 31, 2010, the entire contents of which are incorporated herein by reference.

FIELD

Exemplary embodiments described herein relate generally to a semiconductor memory element and a semiconductor memory device.

BACKGROUND

With the advancement in miniaturization of a semiconductor memory element, making a thinner charge accumulation film which constitutes a semiconductor memory element has been progressing.

A charge accumulation film acts as a charge accumulation layer. Moreover, the charge accumulation film acts as an entity of memory.

A metal-oxide-nitride-oxide-semiconductor, as a (MONOS)-type semiconductor memory device, also has been known.

The semiconductor memory element includes silicon nitride (SiN) as a charge accumulation film.

However, relative permittivity of SiN is approximately 9; therefore, a force of SiN to shield an accumulated charge is weak.

For this reason, the charge accumulation film cannot accumulate a sufficient amount of charge when the charge accumulation film is made thinner as described above.

Especially, when the neighboring memory elements share a continuous charge accumulation film, each of the memory elements cannot fully retain charges accumulated in the charge accumulation film.

Accordingly, there is a problem that the accumulated charges leak to adjacent memory elements.

DETAILED DESCRIPTION

Figure 1:
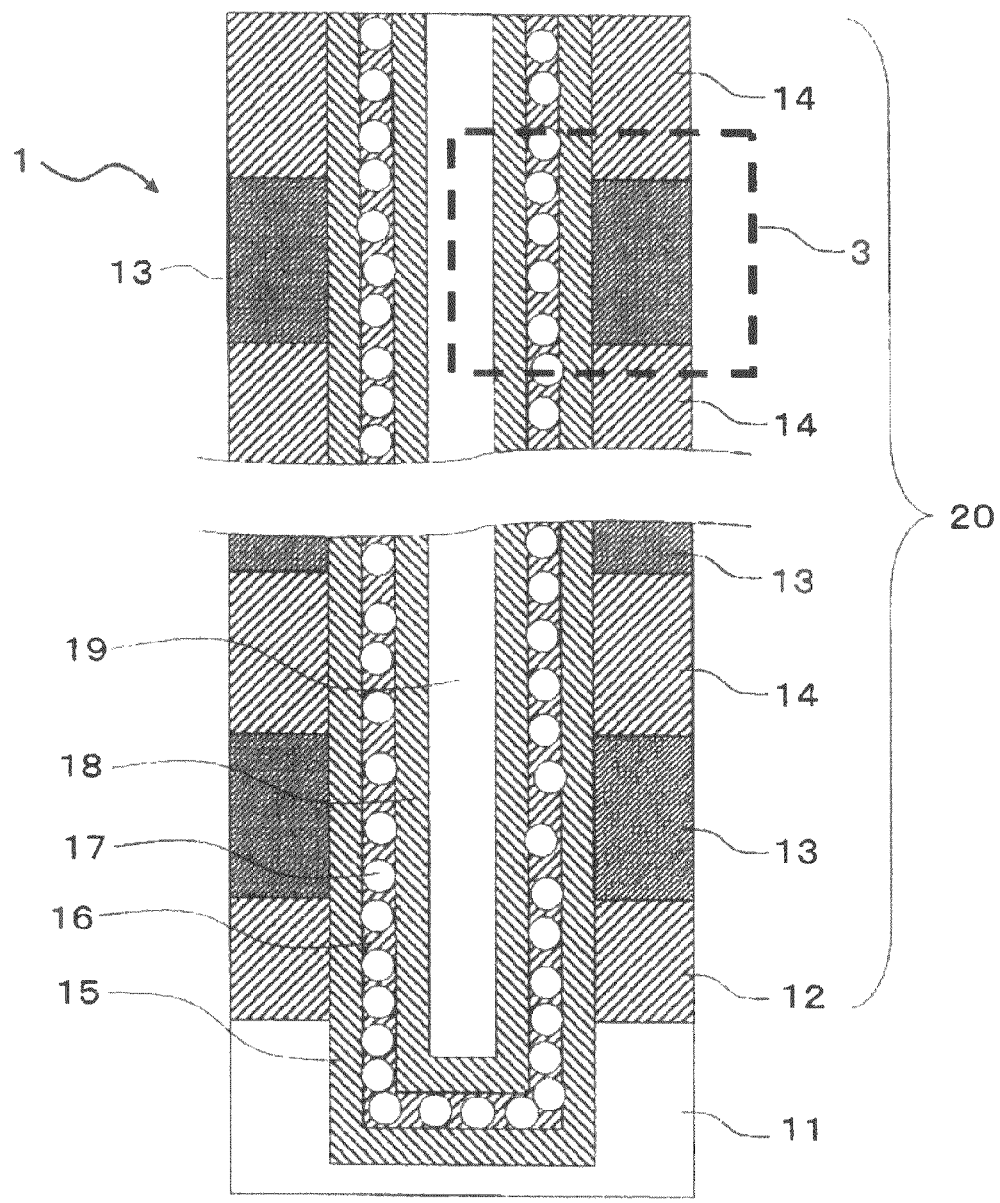
FIG. 1 shows a diagram of a semiconductor memory device according to a first embodiment.

In general, according to one embodiment, a semiconductor memory element includes a semiconductor layer, a tunnel insulator provided on the semiconductor layer, a charge accumulation film provided on the tunnel insulator having a film thickness of 0.9 nm or more and 2.8 nm or less and the charge accumulation film containing cubic $HfO_2$ particles, a block insulator provided on the charge accumulation film, and a control electrode provided on the block insulator.

Embodiments of the present invention will be described below in detail with reference to the attached drawings mentioned above. Throughout the attached drawings, similar or same reference numerals show similar, equivalent or same components.

FIG. 1 shows a structure of a semiconductor memory device 1 according to a first embodiment.

Figure 2:
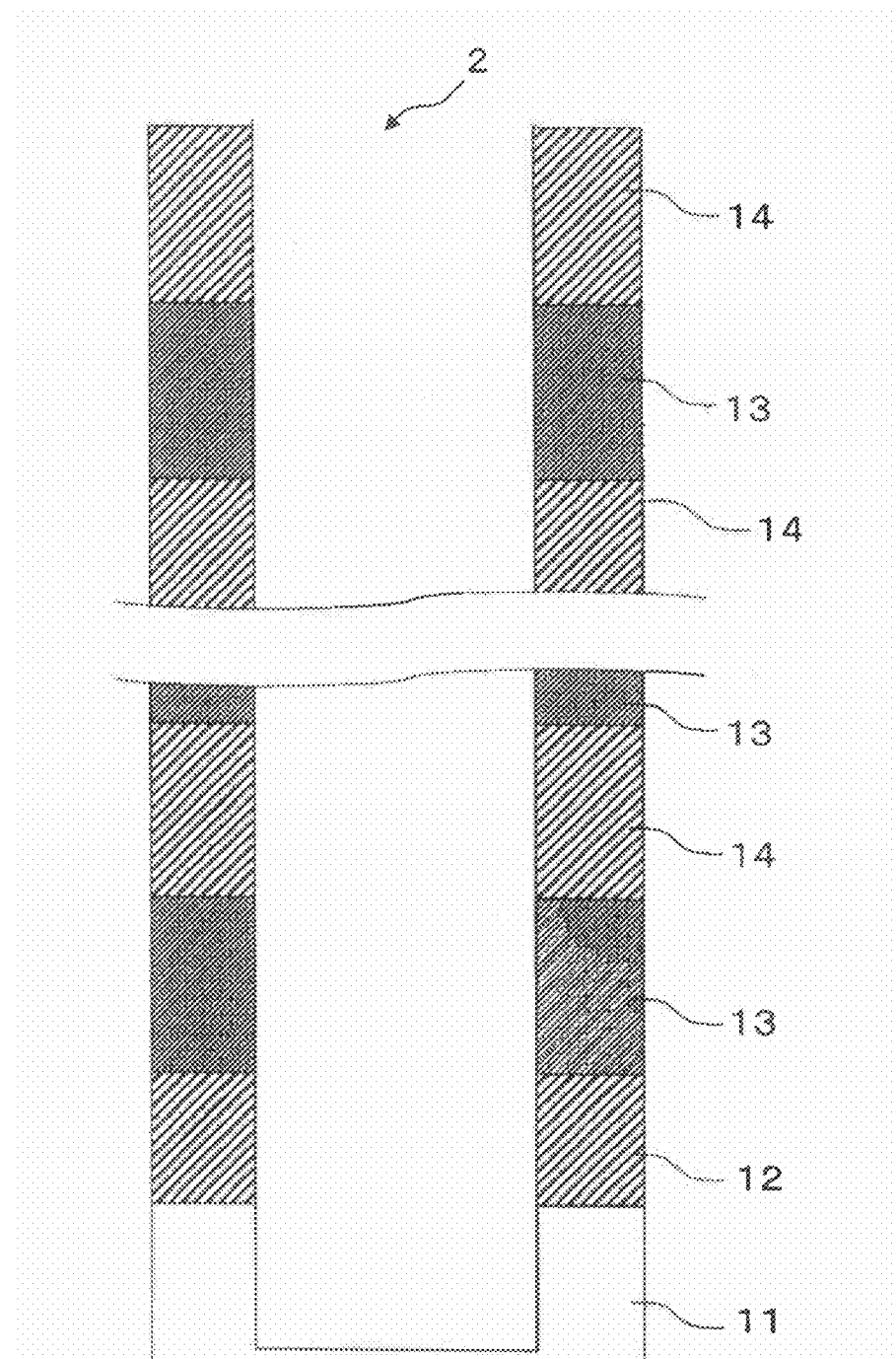
FIG. 2 shows a diagram of a hole formed in a process of manufacturing the semiconductor memory device.

In a semiconductor memory device 1, a substrate insulator 12 (also referred to as an insulator) is configured on a semiconductor substrate 11, and further a control electrode (gate electrode) 13 and a control electrode insulator 14 (also referred to as an insulator) are configured on the substrate insulator 12 in such a manner as to be alternately stacked one above the other in multiple layers. In other words, the semiconductor memory device 1 has a structure in which a stacked body 20 obtained by alternately stacking the insulators 12, 14 and the control electrode 13 one above the other is configured on the semiconductor substrate 11. Further, a hole 2 shown in FIG. 2 is formed from an upper surface of the stacked body 20 down to the semiconductor substrate 11 in the stacking direction of the stacked body 20.

The hole 2 may be formed not to reach the semiconductor substrate 11. Specifically, the hole 2 may be formed down to at least one of the substrate insulator 12, the control electrode 13, or the control electrode insulator 14. It is preferable that the hole is formed down to the bottommost of the control electrodes 13 in multiple layers of the control electrode 13 and the control electrode insulator 14 alternately stacked one above the other.

Further, a block insulator 15, a charge accumulation film 16, a tunnel insulator 18, and a semiconductor layer 19 which serves as a channel region are formed along a side surface of the hole 2, as described in FIG. 1. Further, the charge accumulation film 16 contains cubic $HfO_2$ particles 17.

Incidentally, the control electrode 13 and the control electrode insulator 14 may not be formed in multiple numbers.

The semiconductor memory device 1 is formed with multiple adjacent semiconductor memory elements 3. The region surrounded by the broken line in FIG. 1 corresponds to the semiconductor memory element 3. Specifically, the semiconductor memory element 3 shown in the broken line in FIG. 1 has the tunnel insulator 18, the block insulator 15, and the control electrode 13, which are configured in order on the semiconductor layer 19. Further, the control electrode insulators 14 are configured in such a manner as to face each other with the control electrode 13 in between.

The semiconductor substrate 11 is preferably a single-crystalline silicon (Si) substrate which has an exposed (100) plane. Alternatively, the semiconductor substrate 11 may be a substrate, such as a polycrystalline silicon (poly-Si) substrate, a single-crystalline germanium (Ge) substrate, an epitaxial substrate including a silicon-germanium (SiGe) compound epitaxially grown on a Si substrate, an indium-phosphorus (InP) compound substrate, and a gallium-arsenic (GaAs) compound substrate or the like, which are capable of forming a semiconductor memory device.

The substrate insulator 12 may be an insulator made of $SiO_2$, SiN, $Al_2O_3$, HfSiO, or the like, for example.

The control electrode 13 may be made of highly-doped polycrystalline silicon, for example. Alternatively, the control electrode 13 may be made of a material having a superior electric conductivity. The control electrode 13 may be made of a material, such as Ta, TaC, TaN, TaB, Ta(O, C, N), W, WC, WN, WB, W(O, C, N), Hf, HfC, HfN, HfB, Hf(O, C, N), Re, ReC, ReN, ReO, ReB, Re(O, C, N), Nb, NbC, NbN, NbB, Nb(O, C, N), Mo, MoC, MoN, MoB, Mo(O, C, N), Zr, ZrC, ZrN, ZrB, Zr(O, C, N), Ti, TiC, TiN, TiB, and Ti(O, C, N), for example. Further, the control electrode 13 is preferably superior in heat resistance. In addition, it is preferable that work function of the control electrode 13 can be adjusted to an appropriate value. Specifically, Ta or Ta-compounds may be used.

The control electrode insulator 14 may be an insulator made of $SiO_2$, SiN, $Al_2O_3$, HfSiO, or the like, for example.

The block insulator 15 may be made of $SiO_2$ or $Al_2O_3$, for example.

The charge accumulation film 16 may be made of HfSiO, for example.

In the case where the charge accumulation film 16 is made of HfSiO, the mixing ratio of hafnium (Hf) and silicon (Si) in the HfSiO exclusive of oxygen is preferably set in such a manner that the percentage of Si relative to Hf and Si is 4% or above and 50% or below. This is because it is difficult to form cubic $HfO_2$ particles when the percentage of Si falls below 4% or exceeds 50%.

Further, in the above-described case, it is more preferable that the percentage of Si be 12% or above and 15% or below. This is because relative permittivity of the cubic $HfO_2$ particles 17 reaches its maximum value in this range.

Further, the film thickness of the charge accumulation film 16 is 0.9 nm or more and 2.8 nm or less. When the film thickness of the charge accumulation film 16 exceeds 2.8 nm, the cubic $HfO_2$ particles 17 contained in the charge accumulation film 16 connect to each other. As a result, there arises a possibility that the cubic $HfO_2$ particles 17 cannot accumulate a sufficient amount of charge.

Meanwhile, when the film thickness of the charge accumulation film 16 is thinner than 0.9 nm, the number of the cubic $HfO_2$ particles 17 decreases, and further the particle diameters of the cubic $HfO_2$ particles 17 become smaller. Therefore, the ability of the charge accumulation film 16 to accumulate charge is lowered.

Next, a surface density of the cubic $HfO_2$ particles 17 will be described. The surface density is an index showing how many particles are filled in the film surface of the charge accumulation film 16 in a view from the stacking direction of the charge accumulation film 16. First, the maximum value of the surface density of the cubic $HfO_2$ particles 17 will be described. Supposing cubic $HfO_2$ has a spherical shape, the particle diameter of the cubic $HfO_2$ should be equal to 0.9 nm, which is the minimum value of the thickness of the charge accumulation film 16. Further, suppose that the cubic $HfO_2$ particles 17, each having the minimal particle diameter, are arranged at the maximum density in a 20 nm×20 nm square of the charge accumulation film 16 in a view from the stacking direction of the charge accumulation film 16. First, take one side of the 20 nm×20 nm square. At this time, suppose the sum of the lengths among the cubic $HfO_2$ particles 17 along the side is 3 nm or below. Then, according to the following equation $(20-3)/0.9=18$, eighteen cubic $HfO_2$ particles 17 can fit into the square. Supposing a triangle lattice, which is the closed packing, is arranged along the other side, there would be 21 rows according to the following equation $((20-3)/0.9)/\sqrt{3}/2)=21$. Accordingly, up to 18 particles×21 rows, giving 378 particles, of the cubic $HfO_2$ particles 17 can be arranged in a region having the shortest distance between the gate electrode and the channel region. In this case, the maximum value of the surface density of particles of the cubic $HfO_2$ is 0.945 particles/$nm^2$ according to the following equation $378/(20\times20)=0.945$.

Next, the minimal value of the surface density of the cubic $HfO_2$ particles 17 will be described. Supposing cubic $HfO_2$ has a spherical shape, the particle diameter of the cubic $HfO_2$ should be equal to 2.8 nm, which is the maximum value of the film thickness of the charge accumulation film 16. Suppose that the cubic $HfO_2$ particles 17, each having the maximum particle diameter, are arranged at 2.8 nm intervals in a 20 nm×20 nm square of the charge accumulation film 16 in a view from the stacking direction of the charge accumulation film 16. First, take one side of the 20 nm×20 nm square. In this case, according to 2.8 nm×4 particles (the number of the cubic $HfO_2$ particles 17)+2.8 nm×3 interval (the interval between the cubic $HfO_2$ particles 17)=19.6 nm, four particles can be arranged along the one side. In other words, the cubic $HfO_2$ particles 17 are arranged in 4 rows×4 rows in the 20 nm×20 nm square. Accordingly, 16 particles, which number is given by 4 particles (the number of the cubic $HfO_2$ particles 17 existing in the one side)×2 rows, are arranged in the 20 nm×20 nm square. Thus, 16 particles/(20 nm×20 nm)=0.040 particles/$nm^2$ is the minimum value of the surface density of the cubic $HfO_2$ particles 17.

Accordingly, the surface density of the cubic $HfO_2$ particles 17 contained in the charge accumulation film 16 is 0.040 particles/$nm^2$ or above and 0.945 particles/$nm^2$ or below.

Incidentally, the cubic $HfO_2$ particles 17 contained in the charge accumulation film 16 may include Si. In that case, Si may be tervalent. This is because Si with tervalent has a size equivalent to that of Hf ion, thereby being able to be contained, crystallographically speaking, in the cubic $HfO_2$ particles 17.

The tunnel insulator 18 may be made of $SiO_2$ or oxy-nitride silicon (SiON), for example.

The semiconductor layer 19 may be made of silicon or InGaZnO (IGZO), for example. Alternatively, the semiconductor layer 19 may be made of a semiconductor material, such as various semiconductor nanotubes and various semiconductor nanowires.

Next, the operation principle of a semiconductor memory device 1 according to the embodiment will be described.

In the case of storing information in the semiconductor memory device 1, an arbitrary voltage is applied to the control electrode 13 in multiple semiconductor memory elements 3 constituting the semiconductor memory device 1. In this case, the charges from the semiconductor layer 19 through the tunnel insulator 18 are accumulated in the charge accumulation film 16. When the charges are accumulated in the charge accumulation film 16 in this way, information is stored in the semiconductor memory device 1.

In the semiconductor memory device 1 according to the embodiment, the charges are accumulated in cubic $HfO_2$ particles 17 contained in the charge accumulation film 16. The cubic $HfO_2$ particle 17 used in the embodiment has a defect at an anion site, in comparison to monoclinic $HfO_2$ which is generally generated at ordinary temperature and pressure. Furthermore, accumulating charge in the anion site, the cubic $HfO_2$ particle 17 has a characteristic of having a significantly increased ability of charge accumulation. In this case, the area around the cubic $HfO_2$ particles 17 is insulated by hafnium silicon oxide containing less hafnium, thereby charge leakage within the charge accumulation film 16 can be prevented.

Next, a method of manufacturing the semiconductor memory device 1 according to the embodiment will be described.

First, the substrate insulator 12 is formed on a semiconductor substrate 11. In the case, for example, of using a silicon (100) plane-oriented substrate as the semiconductor substrate 11, $SiO_2$ is formed by thermal oxidation of the silicon (100) plane-oriented substrate by a thermal oxidation method. In the meantime, the substrate insulator 12 may also be formed by use of chemical vapor deposition (CVD), sputtering or the like.

Then, the control electrode 13 is formed on the substrate insulator 12. The control electrode 13 is formed by use of CVD, sputtering, or the like, for example.

Then, a control electrode insulator 14 is formed on the control electrode 13. The control electrode insulator 14 may be formed by use of CVD, sputtering, molecular beam epitaxy (MBE), or the like, for example. Alternatively, the control electrode 13 and the control electrode insulator 14 may be additionally formed in multiple layers on the control electrode insulator 14, if necessary.

Subsequently, a hole 2 is formed relative to the stacking direction of the films formed on the semiconductor substrate 11.

The hole 2 is formed by use of a technique, such as etching and lithography, from the control electrode insulator 14 down to the position of at least one of the semiconductor substrate 11, the substrate insulator 12, the control electrode 13, and the control electrode insulator 14.

Further, the hole 2 may be formed in multiple times. For example, the control electrode 13 and the control electrode insulator 14 are stacked one above the other in four layers, and then the hole 2 is formed in the four layers. Then, the control electrode 13 and the control electrode insulator 14 are again stacked one above the other in four layers, and then the hole is formed in such a manner as to meet the hole 2 formed in advance. Herein, the description has been given of four for the number of the staking of the control electrode 13 and the control electrode insulator 14. However, the number of the stacking of the control electrode 13 and the control electrode insulator 14, and the number of times on forming the hole 2 can be changed as necessary.

Then, a block insulator 15 is formed along the side surface of the hole 2. The block insulator 15 is formed by use of CVD, for example. At this time, the block insulator 15 is formed to such an extent as to allow the hole 2 to be leaved. Alternatively, the block insulator 15 may be formed by use of sputtering. In that case, a high pressure atmosphere, in which the gas pressure in the vicinity of the transition region from the glow region to the arc region is zero or the like, is used.

Then, a sacrifice layer made of silicon (Si) is formed on the surface of the block insulator 15 formed inside the hole 2. Alternatively, the sacrifice layer may be formed between the charge accumulation film 16 and the tunnel insulator 18, which both will be described below. Furthermore, the sacrifice layer may be formed both between the charge accumulation film 16 and the block insulator 15, and between the charge accumulation film 16 and the tunnel insulator 18. Heat treatment after forming the sacrifice layer causes a reaction between $HfO_2$ in the charge accumulation film 16 and Si in the sacrifice layer, resulting in forming the cubic $HfO_2$.

Meanwhile, silicon in the sacrifice layer is formed by use of molecule including silicon atom. Such molecule including silicon atom may be at least one selected from monosilane, disilane, phenyl silane, diethoxymethylsilane, dimethyldimethoxysilane, dimethyldiethoxysilane, methyltrimethoxysilane, methyltriethoxysilane, hexamethyldisiloxane, octamethylcyclotetrasiloxane, 1,1,1,3,3,5,5,5-octamethyltrisiloxane, N,N,N',N',N'',N''-hexamethylsilanetriamine, tetraisocyanatesilane, dimethyldimethoxysilane, tetramethylsilane, trimethylsilane, dimethylsilane, methylsilane, 1,1,3,3-tetramethyl-1,3-disiloxane, trimethoxysilane, trimethylvinylsilane, 1,3,5,7-tetramethylcyclotetrasilioxane, 1,1,1,3,3,3-hexamethyldisilazane, and tetraethoxysilane, especially at least one selected from trisdimethylaminosilane (TDMAS), tetraethoxysilane (TEOS), 1,1,1,3,3,3-hexamethyldisilazane (HMDS), isopropylaminosilane, diisopropylaminosilane, and the like. These materials can be easily vaporized. Introduction of such vaporized molecules near the substrate allows formation of a film containing silicon atom.

The sacrifice layer made of Si is necessary for forming a cubic structure of the $HfO_2$ particle. Specifically, Si contained in the sacrifice layer takes both roles of supplying $Si^{3+}$ to $HfO_2$ and taking away oxygen from $HfO_2$. This is because $HfO_2$, which is stable in a monoclinic structure in general, can be formed to have a cubic structure as gaining $Si^{3+}$ and losing oxygen. Subsequently, the charge accumulation film 16 made of $HfO_2$ is formed on the surface of the sacrifice layer. The charge accumulation film 16 is formed by mixing molecule containing hafnium atom and molecule containing oxygen atom.

Such molecule containing hafnium atom may be at least one selected from alkyl hafnium compounds, organic acid salts of hafnium compounds, alkoxy hafnium compounds, amino-hafnium compounds, β-diketonate compounds of hafnium, cyclopentadienyl compounds, and β-diketonate compounds of hafnium halides, such as hafnium tetrachloride, hafnyl chloride, and hafnyl, especially at least one selected from hafnium chlorides, tetrakis(dimethylamino) hafnium (TDMAH), tetrakis(ethylmethylamino)hafnium (TEMAH), and the like, for example. The alkyl hafnium compounds, the organic acid salts of hafnium compounds, the alkoxy hafnium compounds, the amino-hafnium compounds, the β-diketonate compounds of hafnium, and the cyclopentadienyl compounds described above include alkyl hafnium compounds, such as tetramethyl hafnium, tetraethyl hafnium, tetrapropyl hafnium, tetraisopropyl hafnium, tetrabutyl hafnium, tetraisobutyl hafnium, tetra-2-butyl hafnium, and tetra-3-butyl hafnium, organic acid salts of hafnium and organic acid salts of hafnyl compounds, such as hafnium formate, hafnium acetate, hafnium propionate, hafnium butyrate, hafnium isobutyrate, hafnium valerate, hafnium caproate, hafnium caprylate, hafnium 2-ethylhexanoate, hafnium caprate, hafnium neodecanoate, hafnium rosinate, hafnium naphthenate, hafnyl formate, hafnyl acetate, hafnyl propionate, hafnyl butyrate, hafnyl isobutyrate, hafnyl valerate, hafnyl caproate, hafnyl caprylate, hafnyl 2-ethylhexanoate, hafnyl caprate, hafnyl neodecanoate, hafnyl rosinate, and hafnyl naphthenate, alkoxy hafnium compounds, such as tetrakis(methoxy)hafnium, tetrakis(ethoxy)hafnium, tetrakis (propoxy)hafnium, tetrakis(isopropoxy)hafnium, tetrakis(butoxy)hafnium, tetrakis(isobutyloxy)hafnium, tetrakis(2-butyloxy)hafnium, etrakis(3-butyloxy)hafnium, tetrakis(amyloxy)hafnium, tetrakis(3-amyloxy)hafnium, tetrakis[2-(2-methoxy)ethoxy]hafnium, tetrakis[2-(1-methyl-2-methoxy)propoxy]hafnium, tetrakis[2-(2-methoxy)propoxy]hafnium, tetrakis[2-(dimethylamino)ethoxy]hafnium, tetrakis[2-(2-dimethylamino-1-methyl)propoxy]hafnium, tetrakis[2-(2-dimethylamino)propoxy]hafnium, bis(2-propoxy)bis[2-(2-dimethylamino-1-methyl)propoxy]hafnium, bis(3-butoxy)bis[2-(2-dimethylamino-1-methyl)propoxy]hafnium, bis(3-butoxy)bis[2-(2-dimethylamino)propoxy]hafnium, (3-butoxy)tris[2-(2-dimethylamino-1-methyl)propoxy]hafnium, and tris(3-butoxy)[2-(2-dimethylamino-1-methyl)propoxy]hafnium, amino hafnium compounds, such as tetrakis(dimethylamino)hafnium, tetrakis(diethylamino)hafnium, tetrakis(ethylmethylamino)hafnium, tetrakis(dipropyl)hafnium, tetrakis(dibutylamino)hafnium, bis(dimethylamino)bis(diethylamino)hafnium, bis(diethylamino)bis(ethylmethylamino)hafnium, and (diethylamino)tris(ethylmethylamino)hafnium, amino hafnium compounds, such as bis(methoxy)bis(dimethylamino)hafnium, bis(methoxy)bis(diethylamino)hafnium, bis(methoxy)bis(ethylmethylamino)hafnium, bis(ethoxy)bis(dimethylamino)hafnium, bis(ethoxy)bis(diethylamino)hafnium, bis(ethoxy)bis(ethylmethylamino)hafnium, bis(2-propoxy)bis(diethylamino)hafnium, bis(3-butyl)bis(diethylamino)hafnium, bis(3-butyl)bis(ethylmethylamino)hafnium, and (3-butyl)tris(ethyl methyl)hafnium, hafnium β-diketonate compounds of alkyl-substituted β-diketonates, such as tetrakis(acetylacetonate), tetrakis(hexane-2,4-dionate), tetrakis(5-methylhexane-2,4-dionate), tetrakis(heptane-2,4-dionate), tetrakis-2-methylheptane-3,5-dionate, tetrakis-5-methylheptane-2,4-dionate, tetrakis-6-methylheptane-2,4-dionate, tetrakis-2,2-dimethylheptane-3,5-dionate, tetrakis-2,6-dimethylheptane-3,5-dionate, tetrakis-2,2,6-trimethylheptane-3,5-dionate, tetrakis-2,2,6,6-tetramethylheptane-3,5-dionate, tetrakis-octane-2,4-dionate, tetrakis-2,2,6-trimethyloctane-3,5-dionate, tetrakis-2,6-dimethyloctane-3,5-dionate, tetrakis-2-methyl-6-ethyldecane-3,5-dionate, and tetrakis-2,2-dimethyl-6-ethyldecane-3,5-dionate, of fluorine-substituted alkyl β-diketonates, such as tetrakis-1,1,1-trifluoropentane-2,4-dionate, tetrakis-1,1,1-trifluoro-5,5-dimethylhexane-2,4-dionate, tetrakis-1,1,1,5,5,5-hexafluoropentane-2,4-dionate, and tetrakis-1,3-diperfluorohexylpropane-1,3-dionate, of ether-substituted β-diketonates, such as tetrakis-1,1,5,5-tetramethyl-1-methoxyhexane-2,4-dionate, tetrakis-2,2,6,6-tetramethyl-1-methoxyheptane-3,5-dionate, and tetrakis-2,2,6,6-tetramethyl-1-(2-methoxyethoxy)heptane-3,5-di onate, and the like, and cyclopentadienyl hafnium compounds, such as tetrakis(cyclopentadienyl)hafnium, tetrakis(methylcyclopentadienyl)hafnium, tetrakis(ethylcyclopentadienyl)hafnium, and tetrakis(pentamethylcyclopentadienyl)hafnium, and the like, for example. These materials can be easily vaporized. Introduction of such vaporized molecules near the substrate allows formation of a film containing a hafnium atom. A molecule containing an oxygen atom may be $O_2$, NO, $NO_2$, $N_2O$, $O_3$, CO, $CO_2$, $H_2O_2$, or an alcohol, for example. In this case, a mixture of materials, such as $O_2$, $O_3$, $H_2O_2$, and an alcohol, especially among those listed above is preferably used.

Further, the charge accumulation film 16 is formed by use of atomic layer deposition (ALD), for example. The formation of the charge accumulation film 16 may be performed by use of various film forming techniques belonging to the category of CVD, such as hot-wall thermal CVD, atmospheric pressure CVD (APCVD), low-pressure CVD (LPCVD), ultrahigh vacuum CVD (UHVCVD), AACVD (Aerosol assisted CVD), DLICVD (Direct liquid injection CVD), microwave plasma-assisted CVD (MPCVD), plasma-Enhanced CVD (PECVD), remote plasma-enhanced CVD (RPECVD), ALCVD (atomic layer CVD), HWCVD (hot wire CVD), Cat-CVD (catalytic CVD), HFCVD (hot filament CVD), MOCVD (metalorganic chemical vapor deposition), hybrid physical CVD (HPCVD), Rapid thermal CVD (RTCVD), vapor phase epitaxy (VPE), plasma enhanced CVD (PECVD), high density plasma CVD (HDPCVD), modified CVD (MCVD), digital CVD (DCVD), sub-atmospheric CVD (SACVD), electro chemical deposition (ECD), atomic layer deposition (ALD), and atomic vapor deposition (AVD), for example.

In a method of fabricating a tunnel film, a charge accumulation film, and a block insulator for manufacturing the structure of such a semiconductor memory device in the embodiment, a technique which belongs to the category of CVD is preferably used. It is difficult to form an insulator which covers evenly inside the hole 21 by sputtering, MBE, PVD, coating, or the like, for example, therefore, it is difficult to form the semiconductor memory device according to the embodiment. In the meantime, it is possible to form $HfO_2$ having a stoichiometric composition and metal Hf by MOCVD, ALD, or the like. However, it is difficult to form cubic $HfO_2$ containing at least $Si^{3+}$ or oxygen defect. Accordingly, in order to obtain the charge accumulation film containing the cubic $HfO_2$ particles, it is necessary to provide such a sacrifice layer (Si) as disclosed in the embodiment.

Alternatively, the charge accumulation film 16 may be modified by thermal treatment after the formation of the charge accumulation film 16. There are four purposes for the modification of the charge accumulation film 16. First, it is to remove impurities and the like contained in the charge accumulation film 16. Second, it is to add a composition component which is intended to be contained in the charge accumulation film 16. Third, it is to change the composition distribution of the charge accumulation film 16. Fourth, it is to change the crystalline state of the charge accumulation film 16.

A modifying method of the charge accumulation film 16 may be, in addition to heat treatment, a method using plasma, a method of colliding ions or particles, a method using a gas, such as ozone, having a high reactivity, or a method of colliding particles, such as radicals, which have an inner energy at a higher state than the ground state. Alternatively, a combination of these methods may be adopted for the modification of the charge accumulation film 16.

Figure 3:
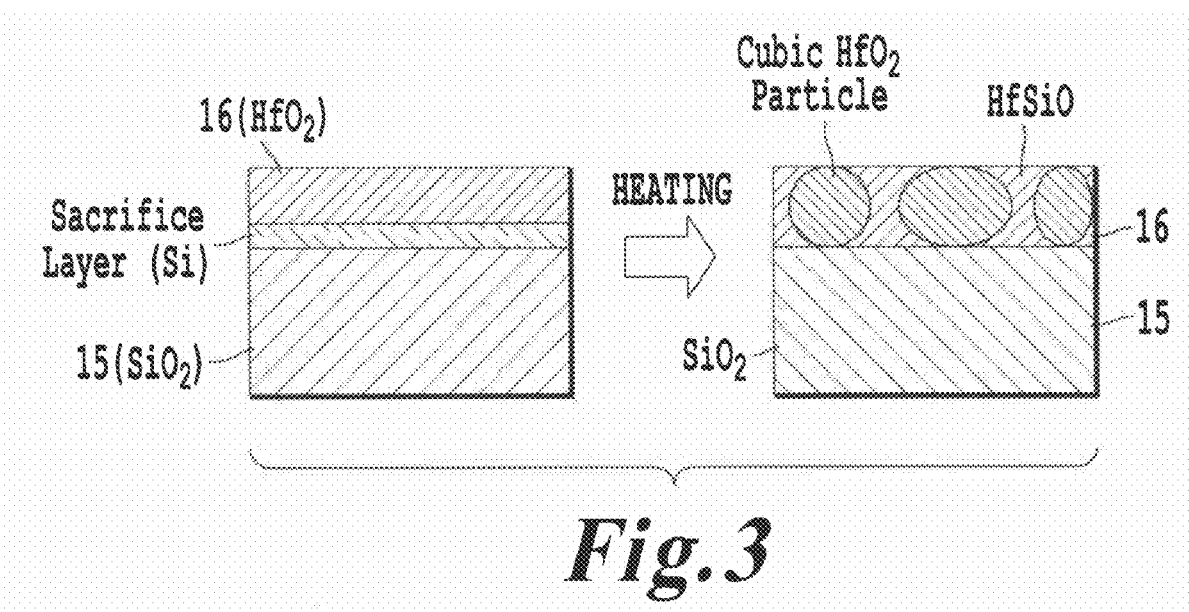
FIG. 3 shows a diagram of formation of cubic $HfO_2$ particles.

FIG. 3 shows that the heat treatment causes a migration of silicon contained in the sacrifice layer into the charge accumulation film 16. As shown in FIG. 3, the heat treatment allows a migration of silicon contained in the sacrifice layer into the charge accumulation film 16. As a result, the cubic $HfO_2$ particles can be formed within the charge accumulation film 16. This is because $HfO_2$ is more stable in terms of energy when $HfO_2$ presents as the cubic $HfO_2$ particles in the modified charge accumulation film 16. Alternatively, when the sacrifice layer is not configured between the block insulator 15 and the charge accumulation film 16, cubic $HfO_2$ particles can be formed as well in the charge accumulation film 16 due to a migration of Si contained in the block insulator 15 into the charge accumulation film 16. Such a case, however, is not preferable because of a possibility of diffusion of other component contained in the block insulator 15.

Incidentally, the process of the heat treatment on the charge accumulation film 16 may be performed during or after the formation of the charge accumulation film 16, after the formation of the semiconductor memory device 1, or the like.

Next, the tunnel insulator 18 is formed along the side surface of the charge accumulation film 16. The tunnel insulator 18 may be formed by use of CVD or various film formation techniques belonging to the category of CVD.

Next, a semiconductor layer 19 is formed along the side surface of the tunnel insulator 18. It is preferable that the semiconductor layer 19 is formed so as to entirely fill the hole 2.

A subsequent manufacturing process of the semiconductor memory device can be carried out by use of conventional techniques, therefore, a description of the subsequent manufacturing process will be omitted.

Figure 4:
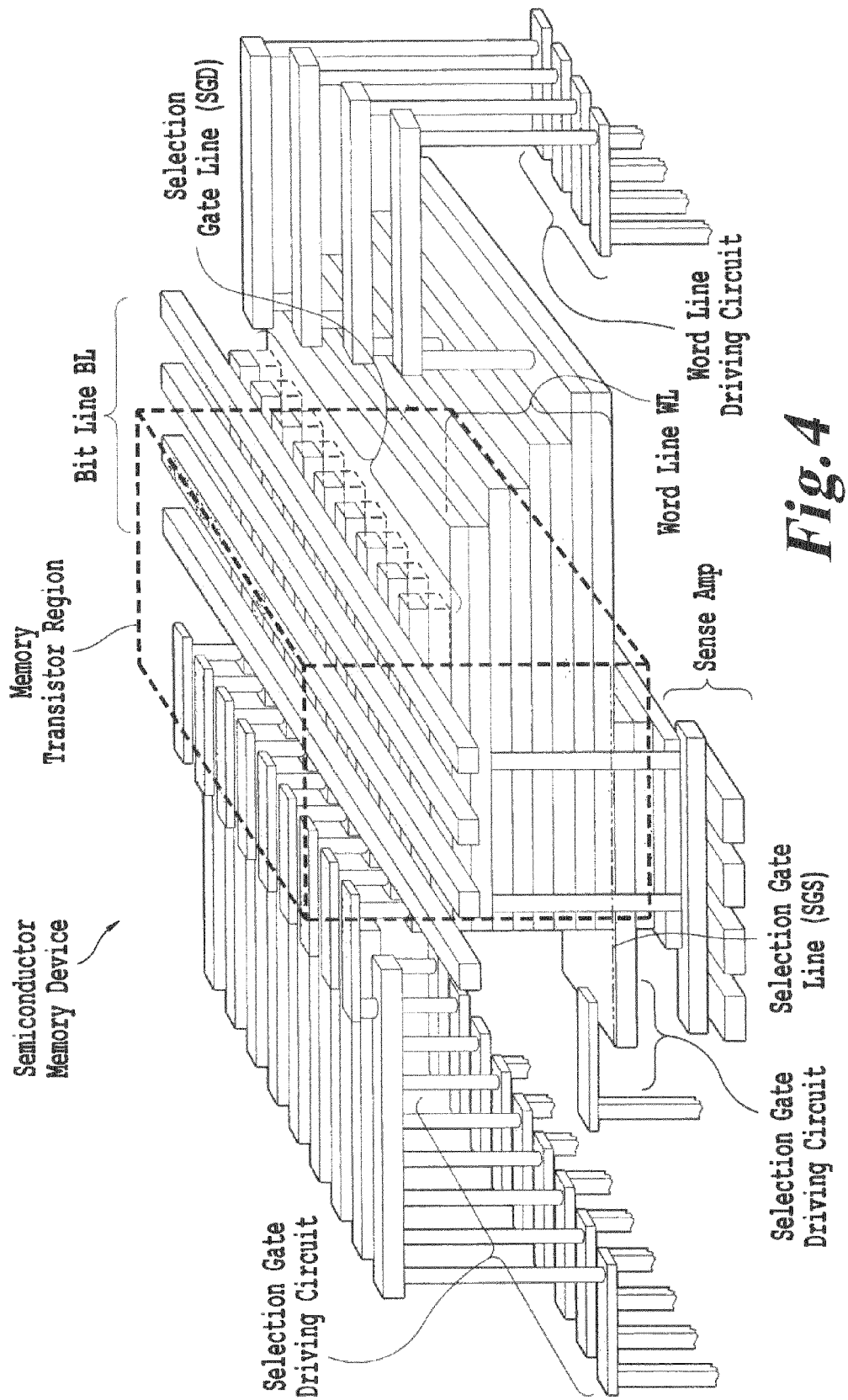
FIG. 4 shows a diagram of a three-dimensional semiconductor memory device using a Bit-Cost Scalable (BiCS) technology.

In addition, the semiconductor memory device 1 according to the embodiment can also be applied to a three-dimensional semiconductor memory device using Bit-Cost Scalable (BiCs) technology as shown in FIG. 4, for example.

Use of the semiconductor memory device 1 according to the embodiment allows accumulation and deletion of charges at high efficiency and long-term retention of accumulated charges.

First Embodiment

A semiconductor memory device 1 according to the first embodiment was manufactured and then evaluated.

The semiconductor substrate 11 was made of a single-crystalline Si, the substrate insulator 12 was made of $SiO_2$, the control electrode 13 was made of highly-doped polycrystalline silicon, the control electrode insulator 14 is made of $SiO_2$, the block insulator 15 was made of $Al_2O_3$, the sacrifice layer was made of Si, the charge accumulation film 16 was made of $HfO_2$, the tunnel insulator 18 was made of $SiO_2$, and the semiconductor layer 19 was made of silicon. In this case, the substrate insulator 12, the control electrode 13, and the control electrode insulator 14 were formed on the semiconductor substrate 11.

Figure 5:
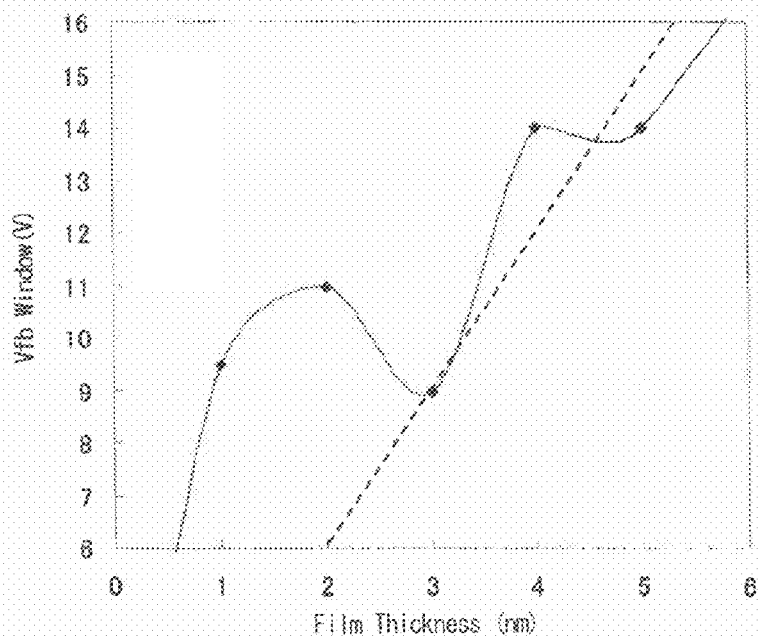
FIG. 5 shows an experimental result on a relationship between the film thickness of a charge accumulation film and a flat-band shift window.

FIG. 5 is a graph showing the experimental result of evaluation of a flat band voltage shift window when the film thickness of the charge accumulation film 16 was changed. The vertical axis represents a flat band shift window (V). The horizontal axis represents the film thickness (nm) of the charge accumulation film 16. In addition, the solid line represents measured values. The broken line represents general behavior of the film thickness of the charge accumulation film 16 and a flat band shift window.

In this case, the ability of the charge accumulation film 16 to accumulate charges can be known by investigating the width of the flat band shift window. Specifically, the amount of charges accumulated in the charge accumulation film 16 is large when the flat band shift window is wide, whereas the amount of charges accumulated in the charge accumulation film 16 is small when the flat band shift window is narrow.

When the film thickness of the charge accumulation film 16 is made thinner as shown by the broken line in FIG. 5, the flat band shift window is narrower. This is because the volume in which charges are accumulated is reduced.

Specifically, as shown by the solid line in FIG. 5, when the film thickness of the charge accumulation film 16 falls below 2.8 nm, the flat band shift window widens. When the film thickness of the charge accumulation film 16 falls below 0.9 nm, the flat band shift window which once widened narrows.

Therefore, it is found that the ability of the charge accumulation film 16 to accumulate charges improves when the film thickness of the charge accumulation film 16 is 0.9 nm or larger and 2.8 nm or smaller.

Next, the semiconductor memory device 1 is formed with the film thickness of the charge accumulation film 16 of 5 nm, 3 nm, 2 nm, or 1 nm. Then, the vicinity of the charge accumulation film 16 was observed by use of transmission electron microscope (TEM).

Figure 6:
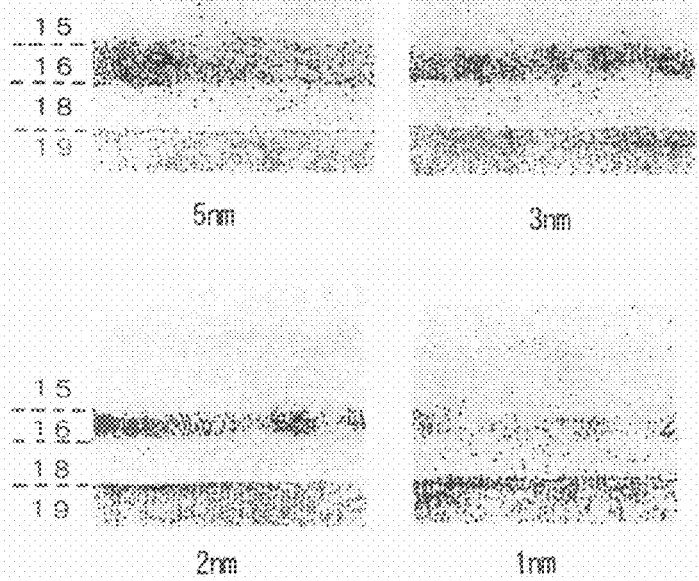
FIG. 6 shows TEM images by cross-sectional TEM observation.
Figures 7A, 7B:
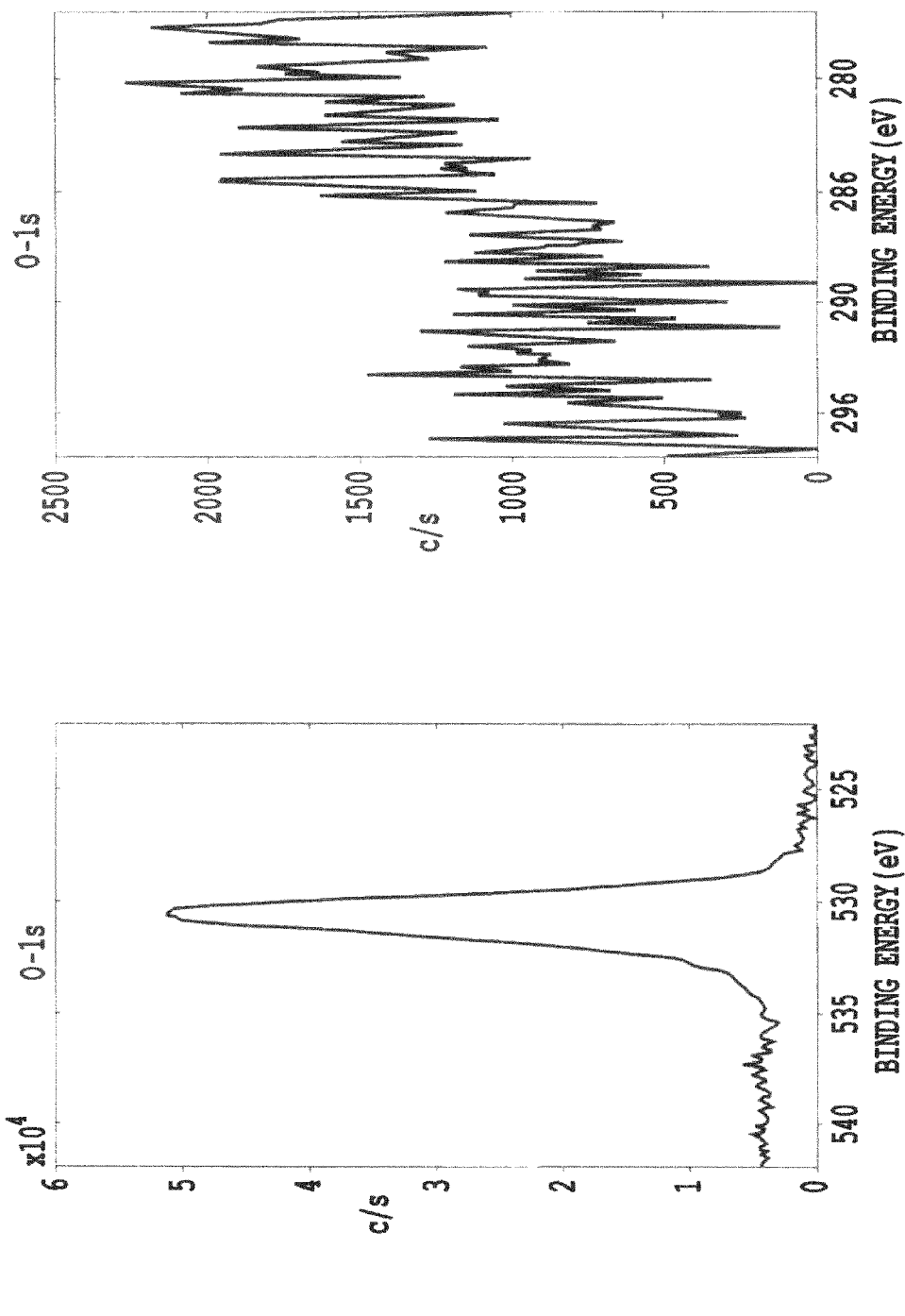
FIGS. 7A-E show experimental results of XPS performed on a charge accumulation film.
Figure 7D:
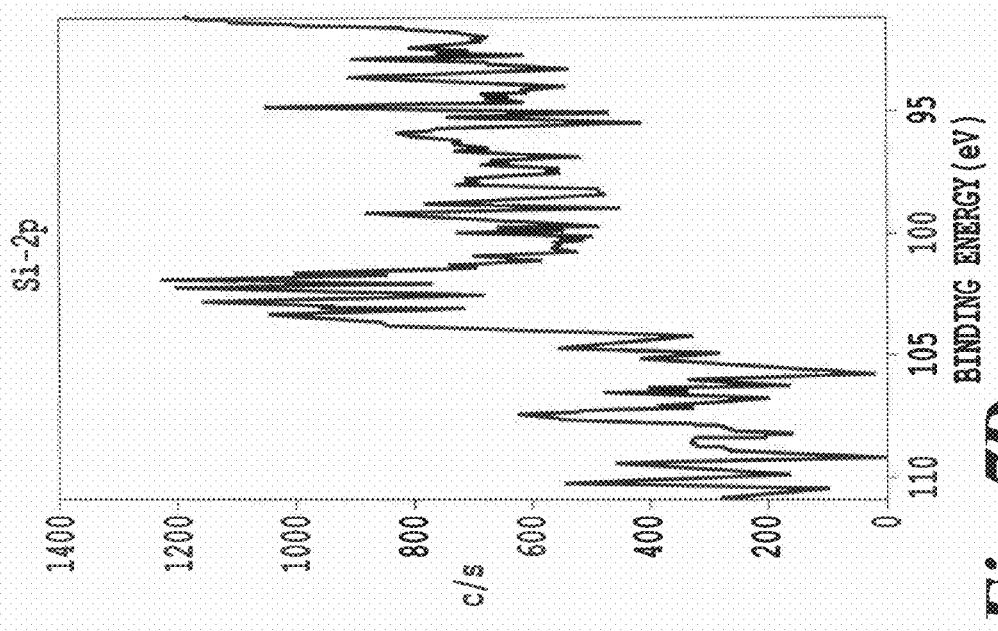
Figure 7C:
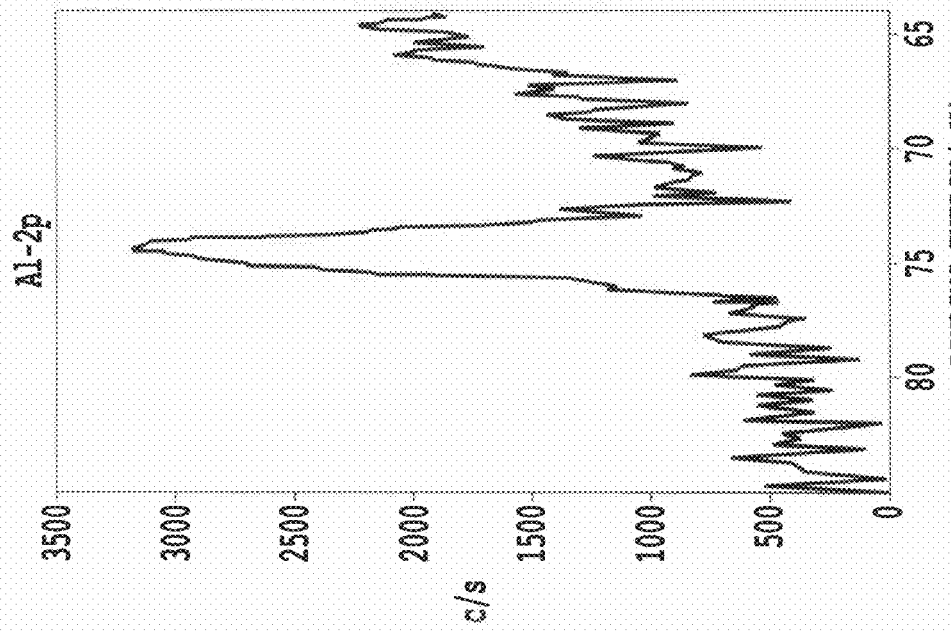
Figure 7E:
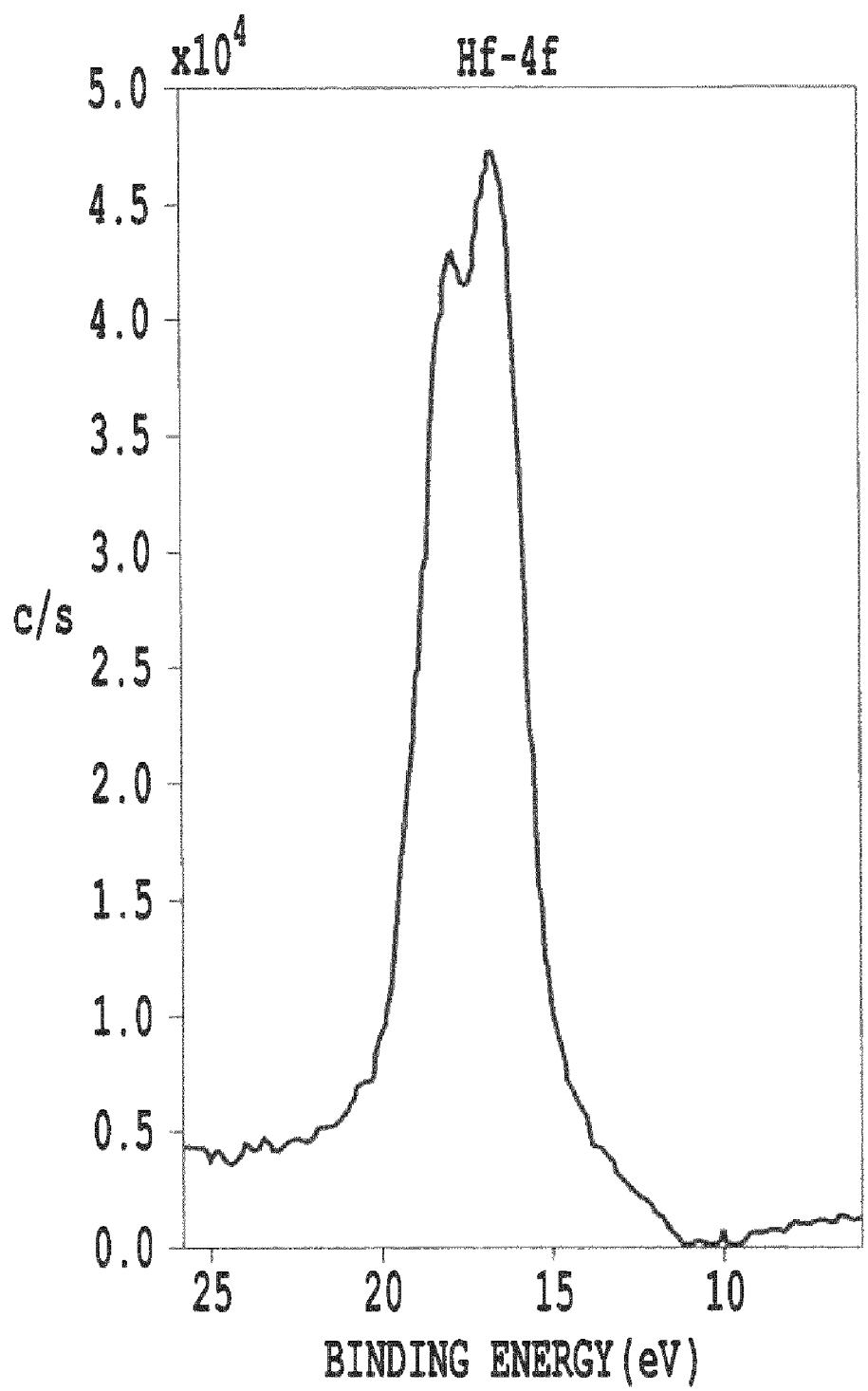

FIG. 6 shows the TEM images by cross-sectional TEM observation of the vicinity of the charge accumulation film 16 of the semiconductor memory device 1 having the film thickness of the charge accumulation film 16 of 5 nm, 3 nm, 2 nm, or 1 nm.

In the charge accumulation film 16, the black region is considered to be cubic $HfO_2$. Since the atomic number of hafnium atom contained in the cubic $HfO_2$ is large, electron beams were scattered, thereby providing such a black region.

It is found that the cubic $HfO_2$ was continuous when the film thickness of the charge accumulation film 16 was 5 nm or 3 nm. On the other hand, it is found that there was a white region when the film thickness of the charge accumulation film 16 was 2 nm or 1 nm. This indicates that the cubic $HfO_2$ split into particles when the film thickness of the charge accumulation film 16 was made thinner.

In other words, it is considered that the cubic $HfO_2$ becomes particles, and therefore the flat band shift window widens when the film thickness of the charge accumulation film 16 was 2.8 nm or smaller, in the results of the film thickness of the charge accumulation film 16 and the flat band shift window described by referring to FIG. 5. Specifically, it is considered that the flat band shift window widens because of accumulation of charge in the cubic $HfO_2$ particles.

Next, the charge accumulation film 16 of the semiconductor memory device 1 formed to have the film thickness of the charge accumulation film 16 of 3 nm is subjected to analysis of film density by glancing incidence X-ray analysis (GIXA) or using an X-ray reflectometer (XR).

As a result of the analysis, the density of $HfO_2$ was estimated to be 10.7 g/cm$^3$. This is approximately identical to the theoretical density of cubic $HfO_2$ 10.4 g/cm$^3$. In the meantime, the theoretical density of the single-crystalline $HfO_2$, for example, is 9.68 g/cm$^3$, and the theoretical density of amorphous $HfO_2$ is further smaller than 9.68 g/cm$^3$. Accordingly, it is inferred that the crystalline structure of the $HfO_2$ particles in the charge accumulation film 16 obtained in the embodiment is cubic.

Next, the composition of the semiconductor memory device 1 formed to have the film thickness of the charge accumulation film 16 of 1 nm was investigated by X-ray photoelectron spectroscopy (XPS) measurement.

In particular, the charge accumulation film 16 is exposed by removing the block insulator 15 by sputtering, and then subjects to the XPS measurement.

FIGS. 7A-E are diagrams showing the experimental result of the XPS measurement performed on the charge accumulation film 16.

Since there exist peaks originating from the 4f orbit of Hf and the 1s orbit of O, it is found that Hf and O were contained in the charge accumulation film 16.

Further, there also exists a peak originating from the 2p orbit of Si. This is assumed to be due to a migration of Si in the sacrifice layer into the charge accumulation film 16, the migration being caused by the heat treatment performed after the formation of the charge accumulation film 16.

Thus, it is found that the cubic $HfO_2$ particles were formed in the charge accumulation film 16.

Second Embodiment

Figure 8:
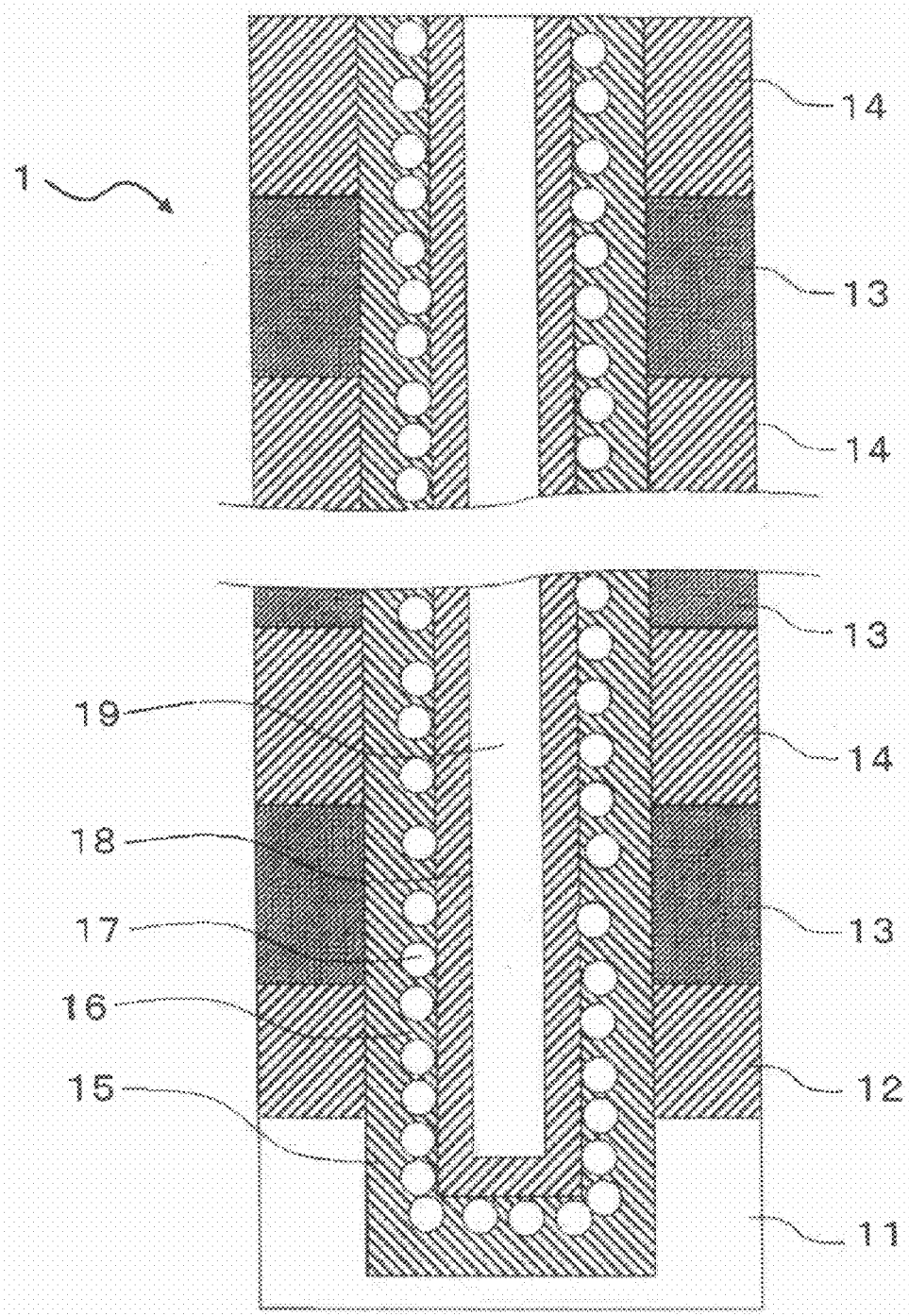
FIG. 8 shows a diagram of a semiconductor memory device according to a second embodiment.

FIG. 8 is a diagram illustrating a semiconductor memory device 1 according to a second embodiment.

The semiconductor memory device 1 according to the embodiment is different from the semiconductor memory device 1 according to the first embodiment in terms of the material of the block insulator 15, the material of the sacrifice layer, and the material of the charge accumulation film 16 which are being mixed together. In addition, the semiconductor memory device 1 according to the embodiment is further different from the semiconductor memory device 1 according to the first embodiment in that the cubic $HfO_2$ particles 17 contained in the charge accumulation film 16 are offset toward the tunnel insulator 18 from the center of the charge accumulation film 16 in a layer thickness direction.

In this case, no clear boundary is observed between the block insulator 15 and the charge accumulation film 16 as illustrated in FIG. 8. The block insulator 15 is made of $SiO_2$, for example. In the meantime, the charge accumulation film 16 is made of HfSiO, for example. In that case, Hf in the HfSiO constituting the charge accumulation film 16 contributes to the cubic $HfO_2$ particles 17, therefore, a region where no cubic $HfO_2$ particles 17 are formed in the charge accumulation film 16 contains a smaller amount of Hf. In other words, the main components of the block insulator 15 and the charge accumulation film 16 exclusive of the cubic $HfO_2$ particles 17 are Si and O.

The main components of the block insulator 15 and the charge accumulation film 16 exclusive of the cubic $HfO_2$ particles 17 can be made approximately identical in this way, therefore, the film thicknesses of the block insulator 15 and the charge accumulation film 16 can be made smaller. Further, the material of the block insulator 15 and the material of the charge accumulation film 16 may be mixed, therefore, a high-temperature heat treatment can be performed in the process of manufacturing the semiconductor memory device 1.

Third Embodiment

Figure 9:
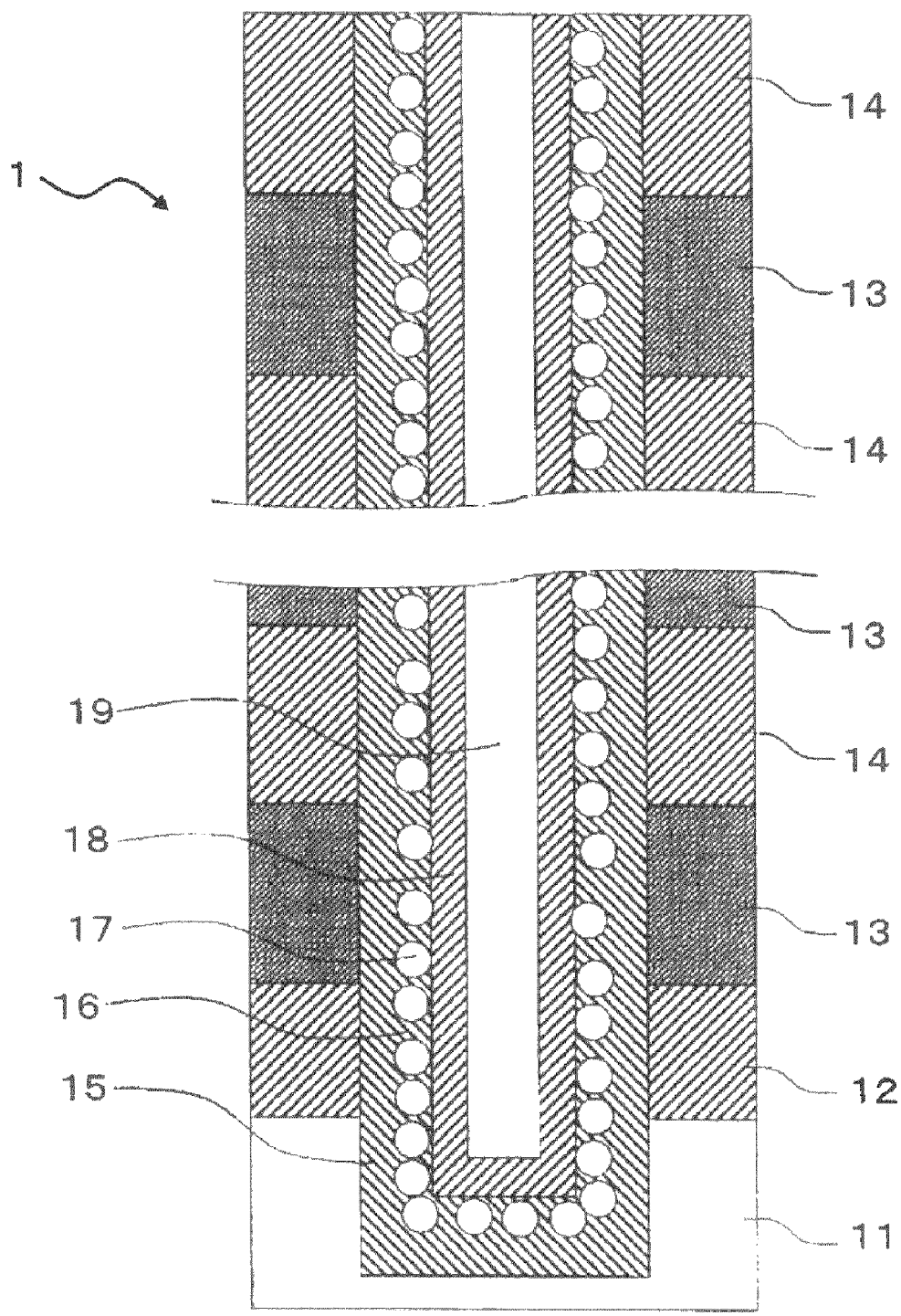
FIG. 9 shows a diagram of a semiconductor memory device according to a third embodiment.

FIG. 9 is a diagram illustrating a semiconductor memory device 1 according to a third embodiment of the invention.

The semiconductor memory device according to the third embodiment is different from the semiconductor memory device 1 according to the first embodiment in terms of the material of the block insulator 15, the material of the sacrifice layer, and the material of the charge accumulation film 16 which are being mixed near the boundary between the block insulator 15 and the charge accumulation film 16. Accordingly, a component of the material of the block insulator 15 decreases towards the charge accumulation film 16. On the other hand, a component of the material of the charge accumulation film 16 decreases towards the block insulator 15. In addition, the semiconductor memory device according to the third embodiment is further different from the semiconductor memory device 1 according to the first embodiment in that the cubic $HfO_2$ particles 17 contained in the charge accumulation film 16 are offset toward the tunnel insulator 18 from the center of the charge accumulation film 16 in the layer thickness direction.

In this case, the material of the block insulator 15 and the material of the charge accumulation film 16 are mixed at the boundary between the block insulator 15 and the charge accumulation film 16, therefore, no clear boundary can be observed as illustrated in FIG. 9.

The block insulator 15 is made of LaAlO, for example. Meanwhile, the charge accumulation film 16 is made of HfSiO, for example. In that case, the components La and Al decrease towards the charge accumulation film 16 from the block insulator 15. In the meantime, the component Si decreases towards the block insulator 15 from the charge accumulation film 16. Incidentally, contributing to the cubic $HfO_2$ particles 17, Hf is unlikely to decrease towards the block insulator 15 from the charge accumulation film 16. LaAlHfSiO which contains a smaller amount of Hf is formed near the boundary between the block insulator 15 and the charge accumulation film 16.

Since the block insulator 15 and the charge accumulation film 16 are mixed at the boundary between the block insulator 15 and the charge accumulation film 16 in this way, the film thicknesses of the block insulator 15 and the charge accumulation film 16 can be made smaller. In addition, the material of the block insulator 15 and the material of the charge accumulation film 16 may be mixed, therefore, a high-temperature heat treatment can be performed in the process of manufacturing the semiconductor memory device 1.

Fourth Embodiment

Figure 10:
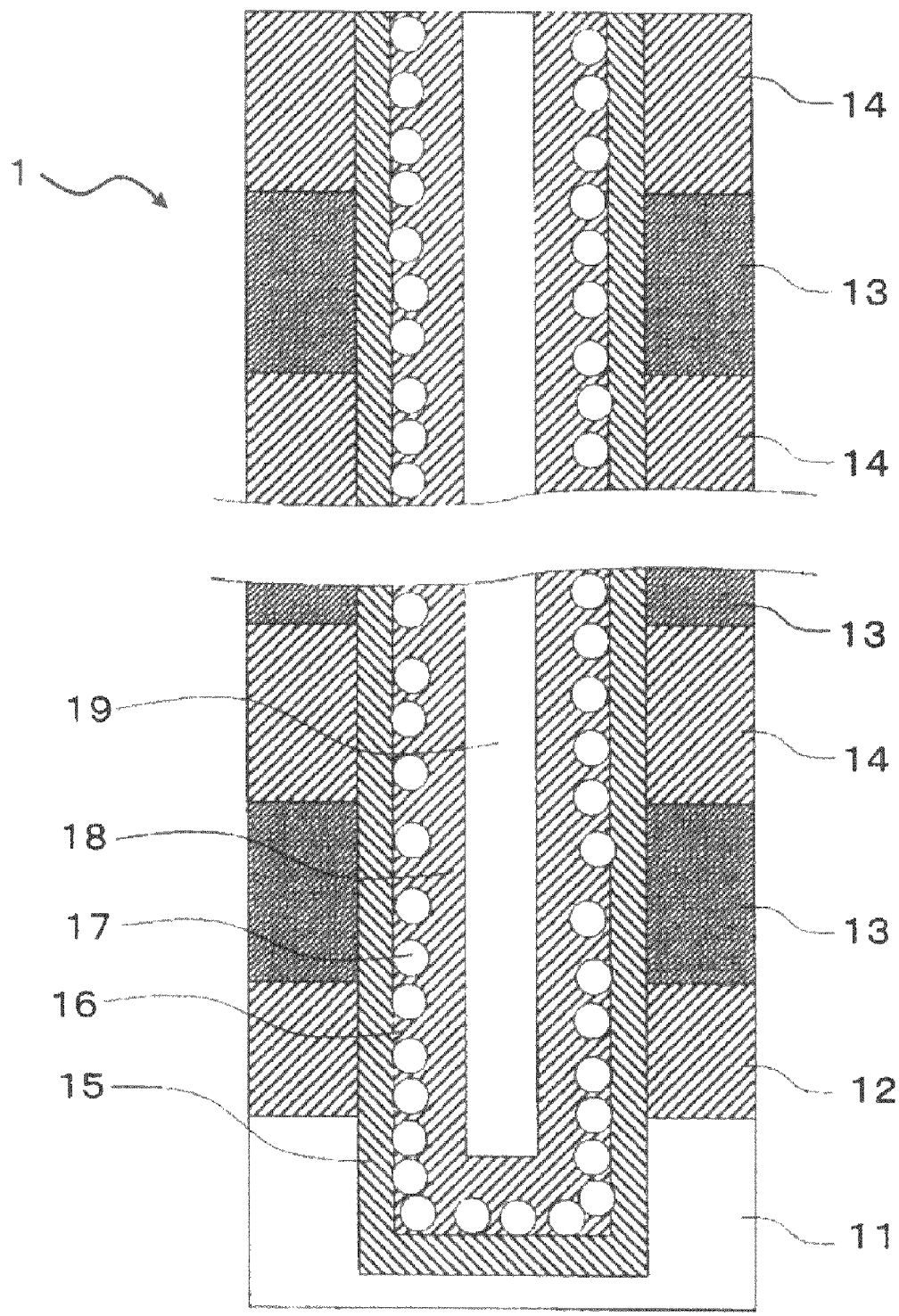
FIG. 10 shows a diagram of a semiconductor memory device according to a fourth embodiment.

FIG. 10 is a diagram illustrating a semiconductor memory device 1 according to a fourth embodiment of the invention.

The semiconductor memory device 1 according to the embodiment is different from the semiconductor memory device 1 according to the first embodiment in terms of the material of the charge accumulation film 16, the material of the sacrifice layer, and the material of the tunnel insulator 18 which are being mixed. In addition, the semiconductor memory device 1 according to the fourth embodiment is further different from the semiconductor memory device 1 according to the first embodiment 1 in that the cubic $HfO_2$ particles 17 contained in the charge accumulation film 16 are offset toward to the block insulator 15 from the center of the charge accumulation film 16 in the layer thickness direction.

In this case, no clear boundary is observed between the charge accumulation film 16 and the tunnel insulator 18 as shown in FIG. 10.

The charge accumulation film 16 is made of HfSiO, for example. Meanwhile, the tunnel insulator 18 is made of $SiO_2$, for example. In that case, Hf of the HfSiO constituting the charge accumulation film 16 contributes to the cubic $HfO_2$ particle 17, therefore, a region where no cubic $HfO_2$ particles 17 are formed in the charge accumulation film 16 contains a smaller amount of Hf. In other words, the main components of the tunnel insulator 18 and the charge accumulation film 16 exclusive of the cubic $HfO_2$ particles 17 are Si and O. For this reason, no clear boundary is observed between the charge accumulation film 16 and the tunnel insulator 18.

The main components of the tunnel insulator 18 and the charge accumulation film 16 exclusive of the cubic $HfO_2$ particles 17 can be made approximately identical in this way, therefore, the film thicknesses of the tunnel insulator 18 and the charge accumulation film 16 can be made smaller. Further, the material of the tunnel insulator 18 and the material of the charge accumulation film 16 may be mixed, therefore, a high-temperature heat treatment can be performed in the process of manufacturing the semiconductor memory device 1.

Fifth Embodiment

Figure 11:
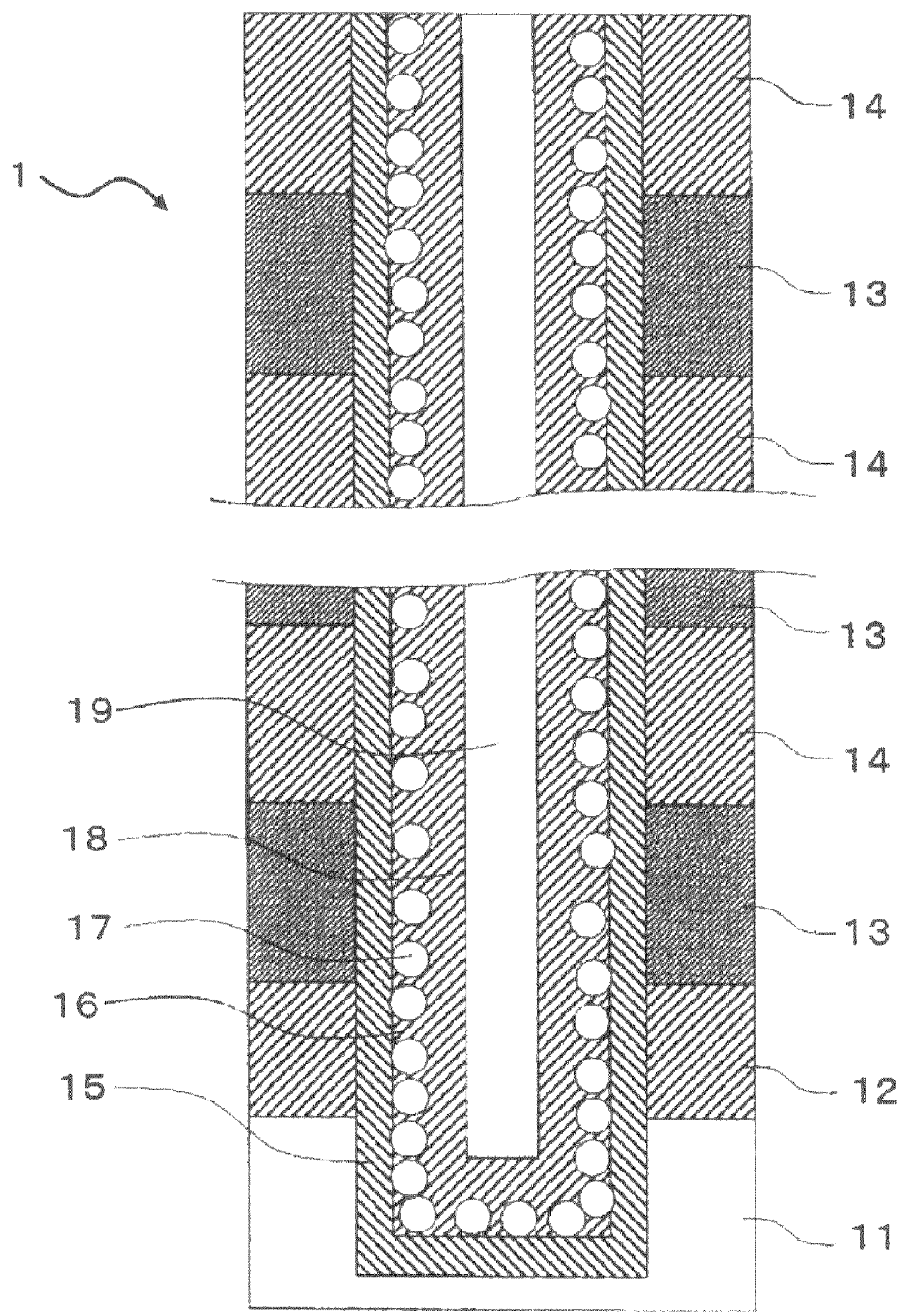
FIG. 11 shows a diagram of a semiconductor device according to a fifth embodiment.

FIG. 11 is a diagram illustrating a semiconductor memory device 1 according to a fifth embodiment of the invention.

A semiconductor memory device according to the embodiment is different from the semiconductor memory device 1 according to the first embodiment in terms of the material of the charge accumulation film 16, the material of the sacrifice layer, and the material of the tunnel insulator 18 which are being mixed near the boundary between the charge accumulation film 16 and the tunnel insulator 18. Accordingly, a component of the material of the tunnel insulator 18 decreases towards the charge accumulation film 16. On the other hand, a component of the material of the charge accumulation film 16 decreases towards the tunnel insulator 18. In addition, the semiconductor memory device according to the embodiment is further different from the semiconductor memory device 1 according to the first embodiment in that the cubic $HfO_2$ particles 17 contained in the charge accumulation film 16 are offset toward the block insulator 15 from the center of the charge accumulation film 16 in the layer thickness direction.

In this case, the material of the charge accumulation film 16 and the material of the tunnel insulator 18 are mixed at the boundary between the charge accumulation film 16 and the tunnel insulator 18, therefore, no clear boundary can be observed as illustrated in FIG. 11.

Further, the charge accumulation film 16 is made of HfLaO, for example. Meanwhile, the tunnel insulator 18 is made of $SiO_2$, for example. In that case, the component Si decreases towards the charge accumulation film 16 from the tunnel insulator 18. In the meantime, the component La decreases towards the tunnel insulator 18 from the charge accumulation film 16. Incidentally, contributing to the cubic $HfO_2$ particles 17, Hf is unlikely to decrease towards the tunnel insulator 18 from the charge accumulation film 16. LaHfSiO which contains a smaller amount of Hf is formed near the boundary between the tunnel insulator 18 and the charge accumulation film 16.

Since the tunnel insulator 18 and the charge accumulation film 16 are mixed at the boundary between the tunnel insulator 18 and the charge accumulation film 16 in this way, the film thicknesses of the tunnel insulator 18 and the charge accumulation film 16 can be made smaller. In addition, the material of the tunnel insulator 18 and the material of the charge accumulation film 16 may be mixed, therefore, a high-temperature heat treatment can be performed in the process of manufacturing the semiconductor memory device 1.

Sixth Embodiment

Figure 12:
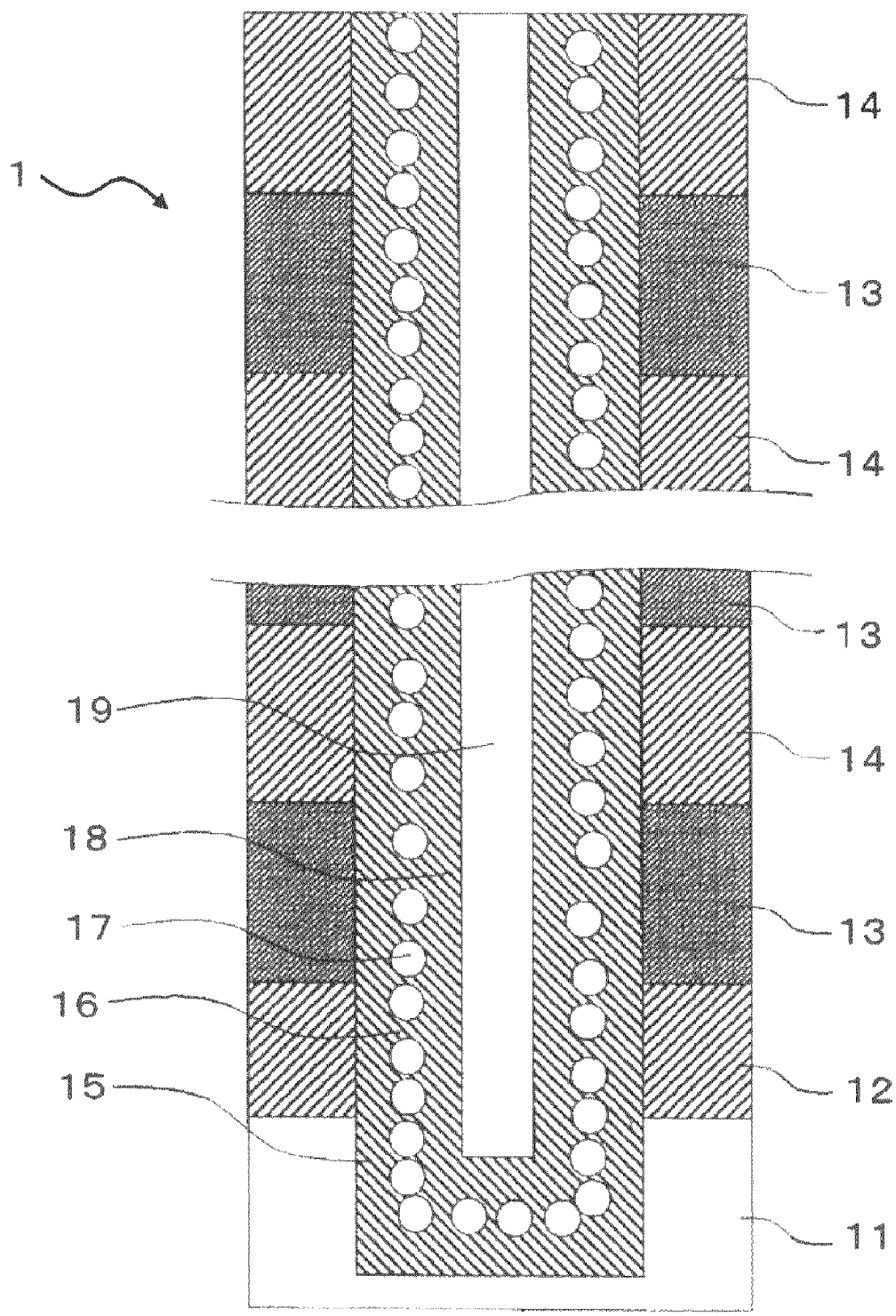
FIG. 12 shows a diagram of a semiconductor memory device according to a sixth embodiment.

FIG. 12 is a diagram illustrating a semiconductor memory device 1 according to a sixth embodiment of the invention.

The semiconductor memory device 1 according to the embodiment is different from the semiconductor memory device 1 according to the first embodiment in terms of the material of the block insulator 15, the material of a sacrifice layer, and the material of the charge accumulation film 16 which are being mixed, and of the material of a tunnel insulator 18 and the material of the charge accumulation film 16 which are being mixed.

In this case, no clear boundary is observed between the block insulator 15 and the charge accumulation film 16 and between the tunnel insulator 18 and the charge accumulation film 16, as shown in FIG. 12.

The charge accumulation film 16 is made of HfSiO, for example. Meanwhile, the block insulator 15 and the tunnel insulator 18 are made of $SiO_2$, for example. In that case, Hf in the HfSiO constituting the charge accumulation film 16 contributes to cubic $HfO_2$ particles 17, therefore, a region where no cubic $HfO_2$ particles 17 are formed in the charge accumulation film 16 contains a smaller amount of Hf. In other words, the main components of the block insulator 15, the tunnel insulator 18, and the charge accumulation film 16 exclusive of the cubic $HfO_2$ particles 17 are Si and O. For this reason, no clear boundary is observed between the block insulator 15 and the charge accumulation film 16 and between the tunnel insulator 18 and the charge accumulation film 16.

The main components of the block insulator 15, the tunnel insulator 18, and the charge accumulation film 16 exclusive of the cubic $HfO_2$ particles 17 can be made approximately identical in this way, therefore, the film thicknesses of the block insulator 15, the charge accumulation film 16, and the tunnel insulator 18 can be made smaller. Further, the material of the block insulator 15, the material of the charge accumulation film 16, and the material of the tunnel insulator 18 may be mixed together; therefore, high-temperature heat treatment can be performed in the process of manufacturing the semiconductor memory device 1.

Seventh Embodiment

Figure 13:
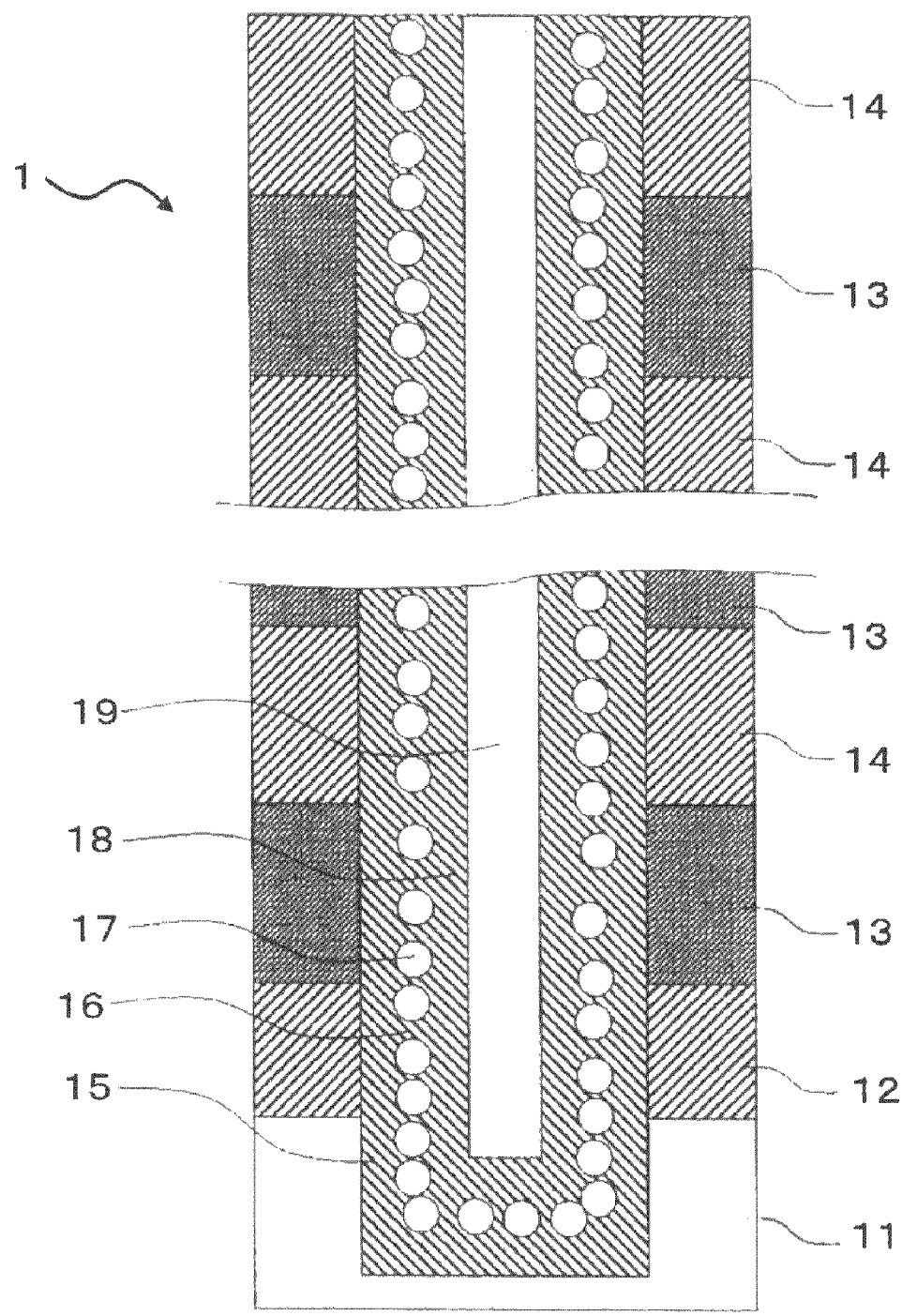
FIG. 13 shows a diagram of a semiconductor memory device according to a seventh embodiment.

FIG. 13 is a diagram illustrating a semiconductor memory device 1 according to a seventh embodiment of the invention.

The semiconductor memory device 1 according to the embodiment is different from the semiconductor memory device 1 according to the first embodiment in terms of the material of the block insulator 15, the material of the sacrifice layer, and the material of the charge accumulation film 16 which are being mixed near the boundary between the block insulator 15 and the charge accumulation film 16. In addition, the semiconductor memory device according to the embodiment is further different from the semiconductor memory device 1 according to the first embodiment as well in terms of the material of the charge accumulation film 16, the material of the sacrifice layer, and the material of the tunnel insulator 18 which are being mixed near the boundary between the charge accumulation film 16 and the tunnel insulator 18. Accordingly, between the block insulator 15 and the charge accumulation film 16, a component of the material of the block insulator 15 decreases towards the charge accumulation film 16. On the other hand, a component of the material of the charge accumulation film 16 decreases towards the block insulator 15. In the meantime, between the charge accumulation film 16 and the tunnel insulator 18, a component of the material of the charge accumulation film 16 decreases towards the tunnel insulator 18. On the other hand, a component of the material of the tunnel insulator 18 decreases towards the charge accumulation film 16.

The block insulator 15 is made of GdAlO, the charge accumulation film 16 is made of HfSiO, and the tunnel insulator 18 is made of SiON.

In that case, between the block insulator 15 and the charge accumulation film 16, the components Gd and Al decrease towards the charge accumulation film 16 from the block insulator 15. In the meantime, the component Si decreases towards the block insulator 15 from the charge accumulation film 16. Incidentally, contributing to the cubic $HfO_2$ particles 17, Hf is unlikely to decrease towards the block insulator 15 from the charge accumulation film 16. GdAlHfSiO which contains a smaller amount of Hf is formed near the boundary between the block insulator 15 and the charge accumulation film 16.

In the meantime, between the charge accumulation film 16 and the tunnel insulator 18, the component N decreases towards the charge accumulation film 16 from the tunnel insulator 18. Incidentally, contributing to the cubic $HfO_2$ particles 17, Hf is unlikely to decrease toward the tunnel insulator 18 from the charge accumulation film 16. HfSiON which contains a smaller amount of Hf is formed near the boundary between the charge accumulation film 16 and the tunnel insulator 18.

Since the block insulator 15 and the charge accumulation film 16 are mixed whereas the charge accumulation film 16 and the tunnel insulator 18 are mixed, the film thicknesses of the block insulator 15, the charge accumulation film 16, and the tunnel insulator 18 can be made smaller. In addition, the block insulator 15 and the charge accumulation film 16 may be mixed together, and the charge accumulation film 16 and the tunnel insulator 18 may be mixed together, therefore, a high-temperature heat treatment can be performed in the process of manufacturing the semiconductor memory device 1.

Eighth Embodiment

Figure 14:
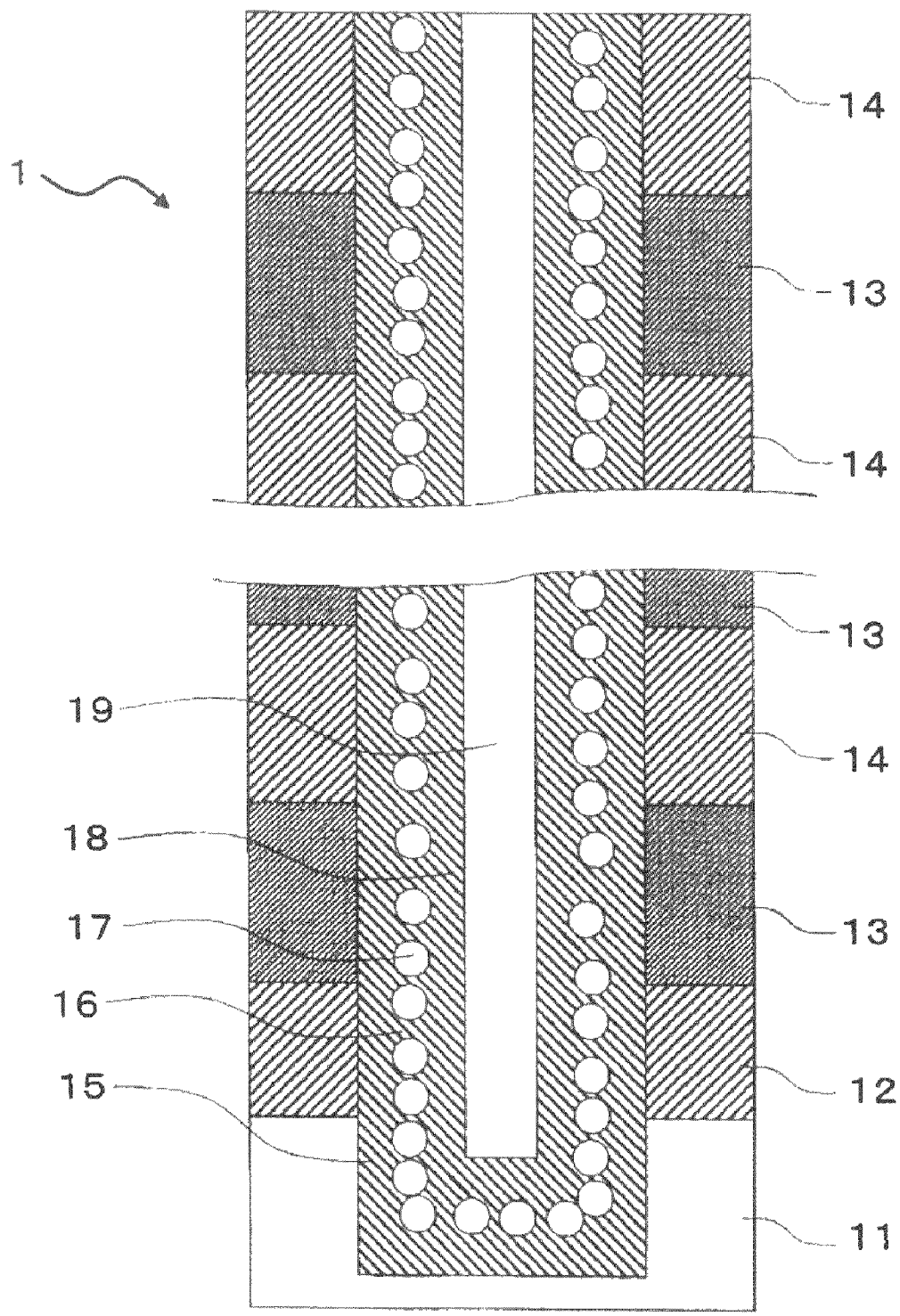
FIG. 14 shows a diagram of a semiconductor memory device according to an eighth embodiment.

FIG. 14 is a diagram illustrating a semiconductor memory device 1 according to an eighth embodiment of the invention.

The semiconductor memory device 1 according to the embodiment is different from the semiconductor memory device 1 according to the first embodiment in terms of the material of the block insulator 15, the material of the sacrifice layer, and the material of a charge accumulation film 16 which are being mixed together near the boundary between the block insulator 15 and the charge accumulation film 16. In addition, the semiconductor memory device 1 according to the embodiment is further different from the semiconductor memory device 1 according to the first embodiment in terms of the material of the charge accumulation film 16 and the material of the tunnel insulator 18 which are being mixed near the boundary between the charge accumulation film 16 and the tunnel insulator 18. Accordingly, between the block insulator 15 and the charge accumulation film 16, a component of the material of the block insulator 15 decreases towards the charge accumulation film 16. On the other hand, a component of the material of the charge accumulation film 16 decreases towards the block insulator 15. In the meantime, between the charge accumulation film 16 and the tunnel insulator 18, a component of the material of the charge accumulation film 16 decreases towards the tunnel insulator 18. On the other hand, a component of the material of the tunnel insulator 18 decreases towards the charge accumulation film 16.

The block insulator 15 is made of YAlO, the charge accumulation film 16 is made of HfSiO, and the tunnel insulator 18 is made of SiGeO.

In that case, between the block insulator 15 and the charge accumulation film 16, the components Y and Al decrease towards the charge accumulation film 16 from the block insulator 15. On the other hand, the component Si decreases towards the block insulator 15 from the charge accumulation film 16. Incidentally, contributing to the cubic HfO$_2$ particles 17, Hf is unlikely to decrease towards the block insulator 15 from the charge accumulation film 16. YAlHfSiO which contains a smaller amount of Hf is formed near the boundary between the block insulator 15 and the charge accumulation film 16.

Meanwhile, between the charge accumulation film 16 and the tunnel insulator 18, the component Ge decreases towards the charge accumulation film 16 from the tunnel insulator 18. Incidentally, contributing to the cubic HfO$_2$ particles 17, Hf is unlikely to decrease towards the tunnel insulator 18 from the charge accumulation film 16. HfSiGeO which contains a smaller amount of Hf is formed near the boundary between the charge accumulation film 16 and the tunnel insulator 18.

Since the block insulator 15, the sacrifice layer, and the charge accumulation film 16 are mixed whereas the charge accumulation film 16, the sacrifice layer, and the tunnel insulator 18 are mixed in this way, the film thicknesses of the block insulator 15, the charge accumulation film 16, and the tunnel insulator 18 can be made smaller. In addition, the block insulator 15 and the charge accumulation film 16 may be mixed together, and the charge accumulation film 16 and the tunnel insulator 18 may be mixed, therefore, high-temperature heat treatment can be performed in the process of manufacturing the semiconductor memory device 1.

While certain embodiments have been described, these embodiments have been presented by way of example only, and are not intended to limit the scope of the inventions. Indeed, the novel elements and devices described herein may be embodied in a variety of other forms; furthermore, various omissions, substitutions and changes in the form of the elements and devices described herein may be made without departing from the spirit of the inventions. The accompanying claims and their equivalents are intended to cover such forms or modifications as would fall within the scope and spirit of the inventions.

What is claimed is:

1. A semiconductor memory element, comprising:
a semiconductor layer;
a tunnel insulator provided on the semiconductor layer;
a charge accumulation film provided directly on the tunnel insulator having a film thickness of 0.9 nm or more and 2.8 nm or less and the charge accumulation film containing cubic HfO$_2$ particles;
a block insulator directly provided on the charge accumulation film; and
a control electrode provided on the block insulator.

2. The memory element of claim 1, wherein
the cubic HfO$_2$ particles contain tervalent silicon, and the charge accumulation film contains silicon and oxygen.

3. The memory element of claim 1, wherein a component of a material in the charge accumulation film between the cubic HfO$_2$ particles and at least one of the tunnel insulator and the block insulator is the same as a component of a material contained in at least one of the tunnel insulator and the block insulator, respectively.

4. The memory element of claim 1, wherein
the cubic HfO$_2$ particles in the charge accumulation film are offset toward the tunnel insulator from the middle of the charge accumulation film in a layer thickness direction,
a component of a material contained in the block insulator is decreased towards the charge accumulation film, and
a component of a material in the charge accumulation film between the cubic HfO$_2$ particles and the block insulator is decreased towards the block insulator.

5. The memory element of claim 1, wherein
the cubic HfO$_2$ particles contained in the charge accumulation film are offset toward the block insulator from the middle of the charge accumulation film in the layer thickness direction,
a component of a material contained in the tunnel insulator is decreased towards the charge accumulation film, and
a component of a material in the charge accumulation film between the cubic HfO$_2$ particles and the tunnel insulator is decreased towards the tunnel insulator.

6. The memory element of claim 1, wherein components of materials between the cubic HfO$_2$ particles and the tunnel insulator, and between the cubic HfO$_2$ particles and the block insulator are the same as components of materials contained in the tunnel insulator and the block insulator, respectively.

7. The memory element of claim 1, wherein
a component of a material contained in the tunnel insulator is decreased towards the charge accumulation film, a component of a material between the cubic HfO$_2$ particles and the tunnel insulator in the charge accumulation film is decreased towards the tunnel insulator,
a component of a material contained in the block insulator is decreased towards the charge accumulation film, and
a component of a material between the cubic HfO$_2$ particles and the block insulator in the charge accumulation film is decreased towards the block insulator.

8. The memory element of claim 1, wherein a surface density of the cubic HfO$_2$ particles contained in the charge accumulation film is 0.040 particles/nm$^2$ or more and 0.945 particles/nm$^2$ or less.

9. The memory element of claim 1, wherein a material of the block insulator is different from a material of the charge accumulation film.

10. The memory element of claim 1, wherein the cubic HfO$_2$ particles include silicon.

11. A semiconductor memory device, comprising:
a stacked body in which an insulator and a control electrode are alternately stacked on a substrate;
a block insulator provided on a side surface of a hole configured to penetrate in a stacking direction of the stacked body from an upper surface of the stacked body to the control electrode of the lowermost layer;
a charge accumulation film provided on an inner surface of the block insulator having a film thickness of 0.9 nm or more and 2.8 nm or less, and containing cubic HfO$_2$ particles;
a tunnel insulator provided on an inner surface of the charge accumulation film; and
a semiconductor layer provided on an inner surface of the tunnel insulator.

12. A semiconductor memory element, comprising:
a semiconductor layer;
a tunnel insulator provided on the semiconductor layer;
a block insulator provided apart from the tunnel insulator, a surface of the block insulator being opposed to a surface of the tunnel insulator, a distance between the tunnel insulator and the block insulator being 0.9 nm or more and 2.8 nm or less;
a charge accumulation film provided between the tunnel insulator and the block insulator, the charge accumulation film containing cubic HfO$_2$ particles; and
a control electrode provided on the block insulator.

13. The memory element of claim 12, wherein the cubic HfO$_2$ particles contain tervalent silicon, and the charge accumulation film contains silicon and oxygen.

14. The memory element of claim 12, wherein a component of a material in the charge accumulation film between the cubic HfO$_2$ particles and at least one of the tunnel insulator and the block insulator is the same as a component of a material contained in at least one of the tunnel insulator and the block insulator, respectively.

15. The memory element of claim 12, wherein
the cubic HfO$_2$ particles in the charge accumulation film are offset toward the tunnel insulator from the middle of the charge accumulation film in a layer thickness direction,
a component of a material contained in the block insulator is decreased towards the charge accumulation film, and
a component of a material in the charge accumulation film between the cubic HfO$_2$ particles and the block insulator is decreased towards the block insulator.

16. The memory element of claim 12, wherein
the cubic HfO$_2$ particles contained in the charge accumulation film are offset toward the block insulator from the middle of the charge accumulation film in the layer thickness direction,
a component of a material contained in the tunnel insulator is decreased towards the charge accumulation film, and
a component of a material in the charge accumulation film between the cubic HfO$_2$ particles and the tunnel insulator is decreased towards the tunnel insulator.

17. The memory element of claim 12, wherein components of materials between the cubic HfO$_2$ particles and the tunnel insulator, and between the cubic HfO$_2$ particles and the block insulator are the same as components of materials contained in the tunnel insulator and the block insulator, respectively.

18. The memory element of claim 12, wherein
a component of a material contained in the tunnel insulator is decreased towards the charge accumulation film,
a component of a material between the cubic HfO$_2$ particles and the tunnel insulator in the charge accumulation film is decreased towards the tunnel insulator,
a component of a material contained in the block insulator is decreased towards the charge accumulation film, and
a component of a material between the cubic HfO$_2$ particles and the block insulator in the charge accumulation film is decreased towards the block insulator.

19. The memory element of claim 12, wherein a surface density of the cubic HfO$_2$ particles contained in the charge accumulation film is 0.040 particles/nm$^2$ or more and 0.945 particles/nm$^2$ or less.

20. The memory element of claim 12, wherein a material of the block insulator is different from a material of the charge accumulation film.

21. The memory element of claim 12, wherein the cubic HfO$_2$ particles include silicon.

* * * * *